(12) United States Patent
Feng et al.

(10) Patent No.: US 12,039,949 B2
(45) Date of Patent: Jul. 16, 2024

(54) SHIFT REGISTER UNIT, GATE DRIVING CIRCUIT, DISPLAY DEVICE, AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 245 days.

(21) Appl. No.: 16/633,041

(22) PCT Filed: Jul. 16, 2019

(86) PCT No.: PCT/CN2019/096184
§ 371 (c)(1),
(2) Date: Jan. 22, 2020

(87) PCT Pub. No.: WO2020/015641
PCT Pub. Date: Jan. 23, 2020

(65) Prior Publication Data
US 2021/0375211 A1 Dec. 2, 2021

(30) Foreign Application Priority Data
Jul. 18, 2018 (CN) .......................... 201810791136.7

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2310/0286* (2013.01)

(58) Field of Classification Search
CPC ..... G09G 3/3266; G09G 3/3674–3681; G09G 2310/0286
See application file for complete search history.

(56) References Cited

U.S. PATENT DOCUMENTS

| 8,400,390 B2* | 3/2013 | Lee | ..................... G09G 3/3677 345/100 |
| 8,698,722 B2* | 4/2014 | Baek | ..................... G09G 3/3677 345/89 |

(Continued)

FOREIGN PATENT DOCUMENTS

| CN | 102800292 A | 11/2012 |
| CN | 202549251 U | 11/2012 |

(Continued)

OTHER PUBLICATIONS

Mar. 31, 2020—(CN) First Office Action Appn 201810791136.7 with English Translation.

(Continued)

*Primary Examiner* — Patrick F Marinelli
(74) *Attorney, Agent, or Firm* — Banner & Witcoff, Ltd.

(57) ABSTRACT

A shift register unit, a gate driving circuit, a display device, and a driving method are disclosed. The shift register unit includes a blanking input circuit, a blanking control circuit, a blanking coupling circuit, a display input circuit and an output circuit. The blanking input circuit is configured to charge a control node in response to a compensation selection control signal, and to maintain a level of the control node. The blanking control circuit is configured to charge a first node, by using a first clock signal, under control of the level of the control node and the first clock signal. The blanking coupling circuit is electrically connected to the (Continued)

control node, and is configured to control, by coupling, the level of the control node in response to the first clock signal.

20 Claims, 15 Drawing Sheets

(56) References Cited

U.S. PATENT DOCUMENTS

| | | | | |
|---|---|---|---|---|
| 8,878,765 | B2* | 11/2014 | Shin | G09G 3/20 345/100 |
| 9,343,028 | B2* | 5/2016 | Ki | G11C 19/28 |
| 9,576,543 | B2* | 2/2017 | He | G09G 3/3659 |
| 10,192,504 | B2* | 1/2019 | Han | G09G 3/3648 |
| 10,783,820 | B2* | 9/2020 | Noh | H03K 17/162 |
| 10,825,413 | B2* | 11/2020 | Yuan | G09G 3/3677 |
| 10,825,539 | B2* | 11/2020 | Feng | G11C 19/28 |
| 10,957,755 | B2* | 3/2021 | Han | H01L 27/3276 |
| 11,024,235 | B2* | 6/2021 | Feng | G09G 3/3266 |
| 11,094,277 | B2* | 8/2021 | Zheng | G09G 3/20 |
| 11,127,355 | B2* | 9/2021 | Feng | G11C 19/28 |
| 11,158,226 | B2* | 10/2021 | Feng | G09G 3/20 |
| 11,170,707 | B2* | 11/2021 | Feng | G09G 3/3266 |
| 2010/0109996 | A1 | 5/2010 | Park et al. | |
| 2010/0134399 | A1* | 6/2010 | Ki | G11C 19/184 345/94 |
| 2010/0156869 | A1* | 6/2010 | Lee | G09G 3/3677 345/208 |
| 2010/0226473 | A1 | 9/2010 | Liu et al. | |
| 2011/0273417 | A1* | 11/2011 | Shin | G09G 3/20 345/211 |
| 2012/0027160 | A1 | 2/2012 | Tobita | |
| 2012/0326955 | A1 | 12/2012 | Ohara | |
| 2015/0029083 | A1* | 1/2015 | He | G09G 3/3659 345/100 |
| 2015/0036784 | A1 | 2/2015 | Qing et al. | |
| 2017/0032733 | A1 | 2/2017 | Jang | |
| 2017/0069283 | A1 | 3/2017 | You et al. | |
| 2017/0270879 | A1* | 9/2017 | Han | G09G 3/3648 |
| 2018/0025695 | A1 | 1/2018 | Han et al. | |
| 2018/0033363 | A1 | 2/2018 | Lim et al. | |
| 2018/0046311 | A1 | 2/2018 | Gu et al. | |
| 2018/0138256 | A1* | 5/2018 | Han | G09G 3/3266 |
| 2018/0337682 | A1* | 11/2018 | Takasugi | G09G 3/3266 |
| 2019/0103049 | A1* | 4/2019 | Noh | G09G 3/20 |
| 2019/0108476 | A1 | 4/2019 | Rivalto et al. | |
| 2019/0108809 | A1* | 4/2019 | Zheng | G09G 3/3677 |
| 2020/0035316 | A1* | 1/2020 | Feng | G09G 3/3208 |
| 2020/0168162 | A1* | 5/2020 | Feng | G11C 19/28 |
| 2020/0184872 | A1* | 6/2020 | Yuan | G11C 19/28 |
| 2020/0357342 | A1* | 11/2020 | Feng | G09G 3/3208 |
| 2020/0403051 | A1* | 12/2020 | Han | G09G 3/3275 |
| 2021/0182784 | A1 | 6/2021 | Minh et al. | |
| 2021/0201751 | A1* | 7/2021 | Feng | G09G 3/2092 |
| 2021/0209987 | A1* | 7/2021 | Feng | G09G 3/20 |
| 2021/0210017 | A1* | 7/2021 | Feng | G11C 19/28 |
| 2021/0327363 | A1* | 10/2021 | Feng | G11C 19/28 |
| 2021/0375211 | A1* | 12/2021 | Feng | G11C 19/28 |

FOREIGN PATENT DOCUMENTS

| | | |
|---|---|---|
| CN | 105161134 A | 12/2015 |
| CN | 106023943 A | 10/2016 |
| CN | 106257515 A | 12/2016 |
| CN | 106486082 A | 3/2017 |
| CN | 106847221 A | 6/2017 |
| CN | 107093049 A | 8/2017 |
| CN | 107464539 A | 12/2017 |
| CN | 107705762 A | 2/2018 |
| CN | 107958649 A | 4/2018 |
| CN | 108281123 A | 7/2018 |
| CN | 109935209 A | 6/2019 |
| CN | 112465528 A | 3/2021 |
| CN | 112734527 A | 4/2021 |
| JP | 2008276849 A | 11/2008 |
| JP | 2018018050 A | 2/2018 |
| KR | 20160068081 A | 6/2016 |
| KR | 20170078978 A | 7/2017 |
| TW | 202125395 A | 7/2021 |
| WO | 2011114563 A1 | 9/2011 |

OTHER PUBLICATIONS

Feb. 21, 2022—(EP) Partial Supplementary European Search Report 19837382.1.
Jun. 14, 2022—(EP) Extended European Search Report Appn No. 19837382.1.
Jul. 10, 2023—(JP) Office Action Appn 2019-565274, with English Translation.
NPL—Internet Blog SOLD OUT Function Teaching—Cooperative Fresh Merchant Uber blog (https://www.uber.com/zh-TW/blog/grocery-ooi <https://protect-us.mimecast.com/s/2TcpCKrAOGUDgNprpAh6a>)—Apr. 9, 2021, machine translation.
NPL—Youtube Merchant Partner Exclusive Channel UberEats_Mobile Teaching by order (https://www.youtube.com/watch?v=ruUcOedyUg8&ab_channel=UberEats%E5%95%86%E5%AE%B6%E5%90%88%E4%BD%9C% <https://protect-us.mimecast.com/s/ZzijM87jXU2K1VmTGiEi2>)—May 24, 2021, machine translation.

* cited by examiner

SHIFT REGISTER UNIT, GATE DRIVING CIRCUIT, DISPLAY DEVICE, AND DRIVING METHOD The application is a U.S. National Phase Entry of International Application No. PCT/CN2019/096184 filed on Jul. 16, 2019, designating the United States of America and claiming priority to Chinese Patent Application No. 201810791136.7, filed on Jul. 18, 2018. The present application claims priority to and the benefit of the above-identified applications and the above-identified applications are incorporated by reference herein in their entirety.

TECHNICAL FIELD

Embodiments of the present disclosure relate to a shift register unit, a gate driving circuit, a display device, and a driving method.

BACKGROUND

Currently in the display field, especially in an OLED (organic light-emitting diode) display panel, a gate driving circuit is generally integrated in a GATE IC. The area of a chip in IC design is a main factor affecting the cost of the chip, and technology developers need to focus on how to effectively reduce the area of the chip.

SUMMARY

At least an embodiment of the present disclosure provides a shift register unit, comprising a blanking input circuit, a blanking control circuit, a blanking coupling circuit, a display input circuit and an output circuit, the blanking input circuit is configured to charge a control node in response to a compensation selection control signal, and to maintain a level of the control node; the blanking control circuit is configured to charge a first node, by using a first clock signal, under control of the first clock signal and the level of the control node; the blanking coupling circuit is electrically connected to the control node, and is configured to control, by coupling, the level of the control node in response to the first clock signal; the display input circuit is configured to charge the first node in response to a display input signal; and the output circuit is configured to output a composite output signal to an output terminal under control of a level of the first node.

For example, in the shift register unit provided by an embodiment of the present disclosure, the blanking input circuit comprises a first transistor and a first capacitor; a gate electrode of the first transistor is connected to a compensation selection control terminal to receive the compensation selection control signal, a first electrode of the first transistor is connected to a blanking input signal terminal, and a second electrode of the first transistor is connected to the control node; and a first electrode of the first capacitor is connected to the control node, and a second electrode of the first capacitor is connected to a first voltage terminal.

For example, in the shift register unit provided by an embodiment of the present disclosure, the blanking control circuit comprises a second transistor and a third transistor; a gate electrode of the second transistor is connected to the control node, a first electrode of the second transistor is connected to a first clock signal terminal to receive the first clock signal, a second electrode of the second transistor is connected to a first electrode of the third transistor; and a gate electrode of the third transistor is connected to the first clock signal terminal to receive the first clock signal, and a second electrode of the third transistor is connected to the first node.

For example, in the shift register unit provided by an embodiment of the present disclosure, the blanking coupling circuit comprises a first coupling capacitor, a first electrode of the first coupling capacitor is connected to the first clock signal terminal to receive the first clock signal, and a second electrode of the first coupling capacitor is connected to the control node.

For example, in the shift register unit provided by an embodiment of the present disclosure, the blanking coupling circuit further comprises a second coupling capacitor. A first electrode of the second coupling capacitor is connected to the second electrode of the second transistor, and a second electrode of the second coupling capacitor is connected to the control node.

For example, in the shift register unit provided by an embodiment of the present disclosure, the display input circuit comprises a fourth transistor, a gate electrode of the fourth transistor is connected to a display input signal terminal to receive the display input signal, a first electrode of the fourth transistor is connected to a second voltage terminal to receive a second voltage, a second electrode of the fourth transistor is connected to the first node.

For example, in the shift register unit provided by an embodiment of the present disclosure, wherein the output terminal comprises a shift signal output terminal and a pixel scanning signal output terminal, the shift signal output terminal and the pixel scanning signal output terminal output the composite output signal, and the output circuit comprises a fifth transistor and a sixth transistor; a gate electrode of the fifth transistor is connected to the first node, a first electrode of the fifth transistor is connected to a second clock signal terminal to receive a second clock signal and the second clock signal is used as the composite output signal, and a second electrode of the fifth transistor is connected to the shift signal output terminal; and a gate electrode of the sixth transistor is connected to the first node, a first electrode of the sixth transistor is connected to the second clock signal terminal to receive the second clock signal and the second clock signal is used as the composite output signal, and a second electrode of the sixth transistor is connected to the pixel scanning signal output terminal.

For example, in the shift register unit provided by an embodiment of the present disclosure, the output circuit further comprises a second capacitor, a first electrode of the second capacitor is connected to the first node, and a second electrode of the second capacitor is connected to the second electrode of the fifth transistor.

For example, the shift register unit provided by an embodiment of the present disclosure further comprises a first control circuit and a node control circuit, the output terminal comprises a shift signal output terminal and a pixel scanning signal output terminal, and the shift signal output terminal and the pixel scanning signal output terminal output the composite output signal; the first control circuit is configured to control a level of a second node under control of the level of the first node; and the node control circuit is configured to reset the first node, the shift signal output terminal, and the pixel scanning signal output terminal under control of the level of the second node.

For example, in the shift register unit provided by an embodiment of the present disclosure, the first control circuit comprises a seventh transistor and a ninth transistor; a gate electrode of the seventh transistor is connected to a first electrode of the seventh transistor and is configured to be connected to a third voltage terminal to receive a third voltage, and a second electrode of the seventh transistor is connected to the second node; and a gate electrode of the ninth transistor is connected to the first node, a first electrode of the ninth transistor is connected to the second node, and a second electrode of the ninth transistor is connected to a fifth voltage terminal to receive a fifth voltage.

For example, in the shift register unit provided by an embodiment of the present disclosure, the first control circuit further comprises an eighth transistor, a gate electrode of the eighth transistor is connected to a first electrode of the eighth transistor and is configured to be connected to a fourth voltage terminal to receive a fourth voltage, and a second electrode of the eighth transistor is connected to a third node different from the second node.

For example, in the shift register unit provided by an embodiment of the present disclosure, the node control circuit comprises a tenth transistor, an eleventh transistor, and a twelfth transistor; a gate electrode of the tenth transistor is connected to the second node, a first electrode of the tenth transistor is connected to the first node, and a second electrode of the tenth transistor is connected to a fifth voltage terminal to receive a fifth voltage; a gate electrode of the eleventh transistor is connected to the second node, a first electrode of the eleventh transistor is connected to the shift signal output terminal, and a second electrode of the eleventh transistor is connected to the fifth voltage terminal to receive the fifth voltage; and a gate electrode of the twelfth transistor is connected to the second node, a first electrode of the twelfth transistor is connected to the pixel scanning signal output terminal, and a second electrode of the twelfth transistor is connected to a sixth voltage terminal to receive a sixth voltage.

For example, the shift register unit provided by an embodiment of the present disclosure further comprises a second control circuit and a third control circuit, the second control circuit is configured to control the level of the second node in response to the first clock signal; and the third control circuit is configured to control the level of the second node in response to the display input signal.

For example, in the shift register unit provided by an embodiment of the present disclosure, the second control circuit comprises a thirteenth transistor, and the third control circuit comprises a fourteenth transistor; a gate electrode of the thirteenth transistor is connected to a first clock signal terminal to receive the first clock signal, a first electrode of the thirteenth transistor is connected to the second node, and a second electrode of the thirteenth transistor is connected to a fifth voltage terminal to receive a fifth voltage; and a gate electrode of the fourteenth transistor is connected to a display input signal terminal to receive the display input signal, a first electrode of the fourteenth transistor is connected to the second node, and a second electrode of the fourteenth transistor is connected to the fifth voltage terminal to receive the fifth voltage.

For example, in the shift register unit provided by an embodiment of the present disclosure, the second control circuit comprises a thirteenth transistor and a seventeenth transistor, and the third control circuit comprises a fourteenth transistor; a gate electrode of the thirteenth transistor is connected to a first clock signal terminal to receive the first clock signal, a first electrode of the thirteenth transistor is connected to the second node, and a second electrode of the thirteenth transistor is connected to a first electrode of the seventeenth transistor; a gate electrode of the seventeenth transistor is electrically connected to the control node, and a second electrode of the seventeenth transistor is connected to a fifth voltage terminal to receive a fifth voltage; and a gate electrode of the fourteenth transistor is connected to a display input signal terminal to receive the display input signal, a first electrode of the fourteenth transistor is connected to the second node, and a second electrode of the fourteenth transistor is connected to the fifth voltage terminal to receive the fifth voltage.

For example, the shift register unit provided by an embodiment of the present disclosure further comprises a display reset circuit and a total reset circuit, the display reset circuit is configured to reset the first node in response to a display reset signal; and the total reset circuit is configured to reset the first node in response to a total reset signal.

For example, in the shift register unit provided by an embodiment of the present disclosure, the display reset circuit comprises a fifteenth transistor, and the total reset circuit comprises a sixteenth transistor; a gate electrode of the fifteenth transistor is connected to a display reset signal terminal to receive the display reset signal, a first electrode of the fifteenth transistor is connected to the first node, and a second electrode of the fifteenth transistor is connected to a fifth voltage terminal to receive a fifth voltage; and a gate electrode of the sixteenth transistor is connected to a total reset signal terminal to receive the total reset signal, a first electrode of the sixteenth transistor is connected to the first node, and a second electrode of the sixteenth transistor is connected to the fifth voltage terminal to receive the fifth voltage.

At least an embodiment of the present disclosure further provides a gate driving circuit, comprising a plurality of cascaded shift register units provided by any one of the embodiments of the present disclosure.

For example, the gate driving circuit provided by an embodiment of the present disclosure further comprises a first sub-clock signal line, a second sub-clock signal line, a third sub-clock signal line, and a fourth sub-clock signal line, a (4n−3)th-stage shift register unit of the cascaded shift register units is connected to the first sub-clock signal line to receive a second clock signal, a (4n−2)th-stage shift register unit of the cascaded shift register units is connected to the second sub-clock signal line to receive a second clock signal, a (4n−1)th-stage shift register unit of the cascaded shift register units is connected to the third sub-clock signal line to receive a second clock signal, a (4n)th-stage shift register unit of the cascaded shift register units is connected to the fourth sub-clock signal line to receive a second clock signal, and n is an integer greater than zero.

For example, the gate driving circuit provided by an embodiment of the present disclosure further comprises a fifth sub-clock signal line and a sixth sub-clock signal line, each stage of the cascaded shift register units is connected to the fifth sub-clock signal line to receive a compensation selection control signal, and each stage of the cascaded shift register units is connected to the sixth sub-clock signal line to receive a total reset signal.

At least an embodiment of the present disclosure further provides a display device, comprising the gate driving circuit provided by any one of the embodiments of the present disclosure.

At least an embodiment of the present disclosure further provides a driving method of the shift register unit, comprising a display phase for one frame and a blanking phase for the frame, during the display phase, causing the blanking input circuit to charge the control node in response to the compensation selection control signal and to maintain the level of the control node; and during the blanking phase, causing the blanking control circuit to charge the first node, by using the first clock signal, under control of the first clock signal and the level of the control node, and causing the blanking coupling circuit to control, by coupling, the level of the control node in response to the first clock signal.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
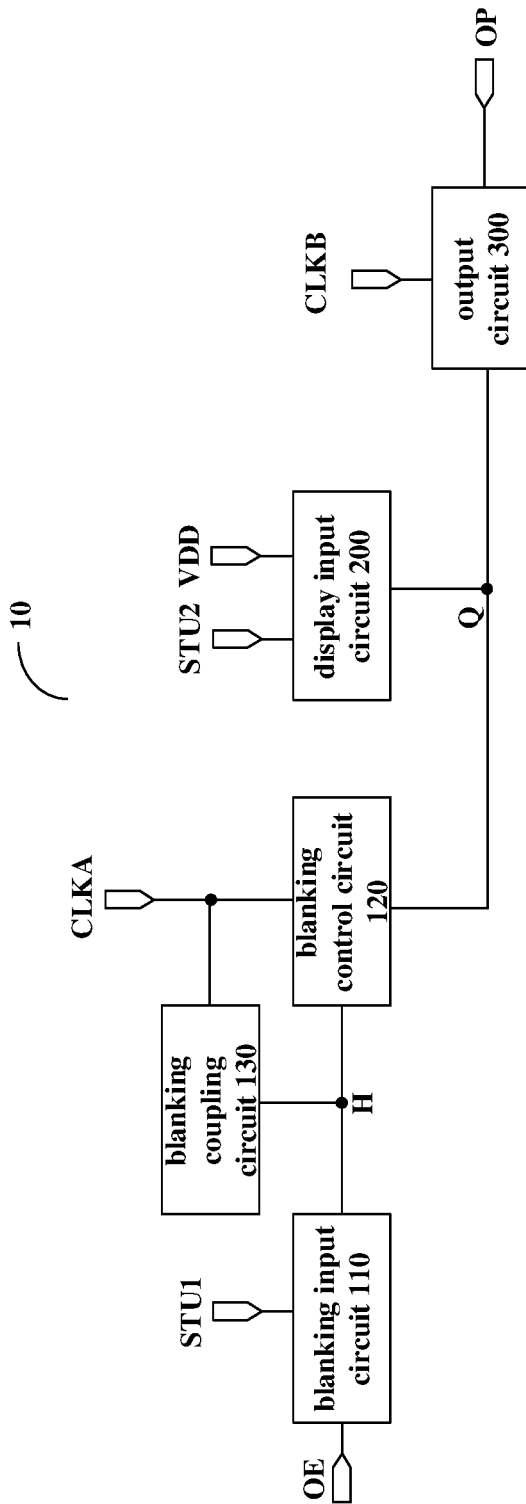
FIG. 1 is a schematic diagram of a shift register unit provided by some embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the present disclosure, for example, in a case where each circuit is implemented by an N-type transistor, the term "pull-up" means charging a node or an electrode of a transistor to allow the absolute value of the level of the node or the electrode to be increased, so as to implement a corresponding operation (e.g., turn-on) of the transistor; and the term "pull-down" means discharging a node or an electrode of a transistor to allow the absolute value of the level of the node or the electrode to be reduced, so as to implement a corresponding operation (e.g., turn-off) of the transistor.

For another example, in a case where each circuit is implemented by a P-type transistor, the term "pull-up" means discharging a node or an electrode of a transistor to allow the absolute value of the level of the node or the electrode to be reduced, so as to implement a corresponding operation (e.g., turn-on) of the transistor; and the term "pull-down" means charging a node or an electrode of a transistor to allow the absolute value of the level of the node or the electrode to be increased, so as to implement a corresponding operation (e.g., turn-off) of the transistor.

Moreover, the specific meanings of the terms "pull-up" and "pull-down" may be further accordingly adjusted based on the specific type of the transistor, as long as the transistor can be controlled to implement the corresponding switch function.

Currently, a gate driving circuit for OLED usually includes three sub-circuits, that is, a detecting circuit, a display circuit, and a connecting circuit (or a gate circuit) for outputting a composite pulse of the detecting circuit and the display circuit. The circuit structure of that gate driving circuit is very complicated and cannot satisfy the requirements for a high resolution and a narrow bezel.

When compensating a sub-pixel unit in the OLED display panel, in addition to providing a pixel compensating circuit in the sub-pixel unit for internal compensation, external compensation may also be performed by providing a sensing transistor. When the external compensation is performed, the gate driving circuit including shift register units needs to provide the sub-pixel unit in the display panel with a driving signal for a scanning transistor and a driving signal for the sensing transistor, respectively. For example, the gate driving circuit provides a scan driving signal for the scanning transistor in a display phase of one frame, and provides a sense driving signal for the sensing transistor in a blanking phase of one frame.

In an external compensation method, the sense driving signal output by the gate driving circuit sequentially scans rows of sub-pixel units line by line. For example, during a blanking phase of a first frame, a sense driving signal for sub-pixel units of a first row of a display panel is output. During a blanking phase of a second frame, a sense driving signal for sub-pixel units of a second row of the display panel is output. And so on, the sense driving signals are outputted sequentially at a frequency of outputting the sense driving signals corresponding to one row of sub-pixel units per frame, that is, the progressive sequential compensation of the display panel is completed.

However, in a case where the above-mentioned progressive sequential compensation method is adopted, the following problems of poor display may occur. One is that there is a scanning line that moves progressively during the scanning display of a plurality of frames of images. The other one is that there are differences in the timing of external compensation, which may cause a large difference in brightness of different regions of the display panel. For example, when the external compensation is performed on the sub-pixel units in the 100th row of the display panel, although the sub-pixel units in the 10th row of the display panel have been externally compensated, at this time, the luminous brightness of the sub-pixel units in the 10th row may have changed, such as a decrease in luminous brightness, which may cause uneven brightness in different regions of the display panel. This problem is more pronounced in large-sized display panels.

In addition, for example, in a shift register unit, a threshold voltage drift of a transistor may cause a leakage or insufficient charging of a control node. For example, during a blanking phase of one frame, when a leakage occurs at the control node, the first node may be insufficiently charged, which may cause the shift register unit to fail to normally output the sense driving signal for the sensing transistor.

At least an embodiment of the present disclosure provides a shift register unit, which includes a blanking input circuit, a blanking control circuit, a blanking coupling circuit, a display input circuit and an output circuit. The blanking input circuit is configured to charge a control node in response to a compensation selection control signal, and to maintain a level of the control node. The blanking control circuit is configured to charge a first node, by using a first clock signal, under control of the first clock signal and the level of the control node. The blanking coupling circuit is electrically connected to the control node, and is configured to control, by coupling, the level of the control node in response to the first clock signal. The display input circuit is configured to charge the first node in response to a display input signal. The output circuit is configured to output a composite output signal to an output terminal under control of a level of the first node. The embodiments of the present disclosure further provide a gate driving circuit, a display device, and a driving method corresponding to the shift register unit described above.

The shift register unit, the gate driving circuit, the display device and the driving method provided in the embodiments of the present disclosure can control, by coupling, the level of the control node, for example, pull up the level of the control node, so that the charging of the first node during a blanking phase of a frame is more sufficient to avoid an abnormal output. In addition, under the premise of taking into account the progressive sequential compensation (such as the need for progressive sequential compensation in a shutdown detection), a random compensation can also be implemented, so that poor display problems such as scanning lines and uneven display brightness caused by progressive sequential compensation can be avoided.

It should be noted that, in the embodiments of the present disclosure, the random compensation refers to an external compensation method that is different from the progressive sequential compensation. By adopting the random compensation, a sense driving signal corresponding to sub-pixel units of any row in the display panel can be output randomly during a blanking phase of a frame. The following embodiments are the same in this aspect and will not be repeated herein.

In addition, in the embodiments of the present disclosure, for the purpose of description, the term "one frame", "each frame" or "a frame" includes a display phase and a blanking phase which are sequentially performed. For example, in the display phase, the gate driving circuit outputs a display output signal, and the display output signal can drive the display panel from the first row to the last row to perform a scanning display of one complete image (that is, perform a scanning display of one frame of an image); and in the blanking phase, the gate driving circuit outputs a blanking output signal, and the blanking output signal can be used to drive sensing transistors in one row of sub-pixel units in the display panel, for example, to extract electrical parameters (such as the threshold voltage of the transistor), and then complete the external compensation according to the electrical parameters.

The embodiments of the present disclosure and examples thereof will be described in detail below with reference to the drawings.

At least an embodiment of the present disclosure provides a shift register unit 10, and as illustrated in FIG. 1, the shift register unit 10 includes a blanking input circuit 110, a blanking control circuit 120, a blanking coupling circuit 130, a display input circuit 200 and an output circuit 300. The blanking control circuit 120, the display input circuit 200, and the output circuit 300 are electrically connected with each other through a first node Q. A plurality of the shift register units 10 can be cascaded to form a gate driving circuit provided by an embodiment of the present disclosure.

It should be noted that, in the embodiments of the present disclosure, the first node Q is, for example, a pull-up node, that is, the pull-up node is an example of the first node Q.

The blanking input circuit 110 is configured to charge a control node H in response to a compensation selection control signal, and to maintain a level of the control node H.

In some embodiments, the blanking input circuit 110 may be connected to a blanking input signal terminal STU1 and a compensation selection control terminal OE, so that the blanking input circuit 110 can charge the control node H, by using a blanking input signal input by the blanking input signal terminal STU1, under control of a compensation selection control signal input by the compensation selection control terminal OE, and can maintain the level of the control node H. For example, the blanking input circuit 110 can charge the control node H in a display phase of one frame, thereby pulling up the level of the control node H to a high level, and can maintain the high level of the control node H to a blanking phase of the frame.

For example, in a case where a plurality of shift register units 10 are cascaded to form a gate driving circuit, except for the first-stage shift register unit, the blanking input signal terminal STU1 of the other stage of the shift register units 10 may be electrically connected to the output terminal OP of the other shift register unit 10 (for example, a previous second-stage shift register unit or a next third-stage shift register unit) other than itself, or may be electrically connected to its own output terminal OP. For example, in a case where the output terminal OP includes a shift signal output terminal CR and a pixel scanning signal output terminal OUT, the blanking input signal terminal STU1 may be connected to the shift signal output terminal CR.

The blanking control circuit 120 is configured to charge a first node Q, by using a first clock signal, under control of the level of the control node H and the first clock signal. For example, in some embodiments, the blanking control circuit 120 may be connected to a first clock signal terminal CLKA to receive the first clock signal, and the blanking control circuit 120 may also be connected to the control node H to be controlled by the level of the control node H. For example, when the control node H and the first clock signal are both at a high level, the blanking control circuit 120 can charge the first node Q by using the high-level first clock signal. For example, during a blanking phase of one frame, the blanking control circuit 120 charges the first node Q.

The blanking coupling circuit 130 is electrically connected to the control node H, and is configured to control, by coupling, the level of the control node H in response to the first clock signal, for example, to pull up the level of the control node H. For example, in some embodiments, the blanking coupling circuit 130 may be connected to the first clock signal terminal CLKA to receive the first clock signal. For example, when the first clock signal changes from a low level to a high level, the blanking coupling circuit 130 can control, by coupling, the level of the control node H through a coupling effect, for example, causing the level of the control node H to be further pulled up. For example, during a blanking phase of one frame, the blanking coupling circuit 130 can control, by coupling, the level of the control node H, for example, pulling up the level of the control node H, which can avoid leakage current at the control node H, thereby allowing the first node Q to be charged more sufficiently in the blanking phase of the frame to avoid the abnormal output of the shift register unit 10.

The display input circuit 200 is configured to charge the first node Q in response to a display input signal. For example, in some embodiments, the display input circuit 200 may be connected to a display input signal terminal STU2 to receive the display input signal, so that the display input circuit 200 can be turned on under control of the display input signal. For example, the display input circuit 200 may also be connected to a second voltage terminal VDD to receive a second voltage, for example, the second voltage is a DC (direct current) high-level. For example, during a display phase of one frame, the display input circuit 200 is turned on under control of the display input signal, thereby charging the first node Q by using the second voltage. It should be noted that, in the embodiments of the present disclosure, the second voltage terminal VDD can be configured to, for example, provide the DC high-level second voltage, which are the same in the following embodiments and will not be described again.

For example, in a case where a plurality of the shift register units 10 are cascaded to form a gate driving circuit, the display input signal terminal STU2 of each stage of the shift register units may be electrically connected to the output terminal of a previous second-stage shift register unit. For example, in a case where the output terminal includes the shift signal output terminal CR and the pixel scanning signal output terminal OUT, the display input signal terminal STU2 may be electrically connected to the shift signal output terminal CR.

It should be noted that, in the embodiments of the present disclosure, the display input circuit 200 may further adopt other configurations, as long as the corresponding functions can be implemented, and the embodiments of the present disclosure are not limited thereto.

The output circuit 30 is configured to output a composite output signal to the output terminal OP under control of the level of the first node Q. For example, in some embodiments, the output circuit 300 may be connected to the second clock signal terminal CLKB to receive the second clock signal and use the second clock signal as the composite output signal. For example, the composite output signal may include a display output signal and a blanking output signal. During a display phase of one frame, the output circuit 300 outputs the display output signal to the output terminal OP under control of the level of the first node Q. For example, in some embodiments, the output terminal OP may include the shift signal output terminal CR and the pixel scanning signal output terminal OUT, the display output signal output from the shift signal output terminal CR can be used for the scanning shift of a previous-stage shift register unit and a next-stage shift register unit, and the display output signal output from the pixel scanning signal output terminal OUT can be used to drive sub-pixel units in the display panel to perform scan display. During a blanking phase of one frame, the output circuit 300 outputs the blanking output signal to the output terminal OP under control of the level of the first node Q, and the blanking output signal can be used to drive the sensing transistor.

It should be noted that, in the embodiments of the present disclosure, the blanking input circuit, the blanking control circuit, and the blanking coupling circuit are provided in the shift register unit in order to implement that the blanking output signal can be output during a blanking phase of one frame. The "blanking" of the blanking input circuit, the blanking control circuit, and the blanking coupling circuit only indicates that these circuits are related to the blanking phase, and does not limit these circuits to work only in the blanking phase. The following embodiments are the same in this aspect and will not be repeated herein.

For example, in some embodiments, a plurality of the shift register units 10 provided by the embodiment of the present disclosure may be cascaded to form a gate driving circuit, and the gate driving circuit can drive a display panel to implement progressive sequential compensation. For example, in a first frame, the compensation selection control signal is made the same as the display output signal for driving the first row of the sub-pixel units, and in a second frame, the compensation selection control signal is made the same as the display output signal for driving the second row of the sub-pixel units, and so on, so as to complete the progressive sequential compensation of the display panel.

For example, in some embodiments, a plurality of the shift register units 10 provided by the embodiment of the present disclosure may be cascaded to form a gate driving circuit, and the gate driving circuit can drive the display panel to implement random compensation. That is, during a frame, the gate driving circuit can be used to drive the sensing transistors in any row of the sub-pixel units, thereby completing external compensation of the row of the sub-pixel units.

For example, in a case where the blanking input signal terminal STU1 of the shift register unit 10 is electrically connected to the output terminal OP of the shift register unit 10, and in a case where the fifth row of the sub-pixel units is needed to perform the external compensation, the compensation selection control signal may be the same as the display output signal for driving the fifth row of the sub-pixel units.

For another example, in a case where the blanking input signal terminal STU1 of the shift register unit 10 is electrically connected to the output terminal OP of a previous second-stage shift register unit 10, and in a case where the fifth row of the sub-pixel units is needed to perform the external compensation, the compensation selection control signal may be the same as the display output signal for driving the third row of the sub-pixel units.

For another example, in a case where the blanking input signal terminal STU1 of the shift register unit 10 is electrically connected to the output terminal OP of a next third-stage shift register unit 10, and in a case where the fifth row of the sub-pixel units is needed to perform the external compensation, the compensation selection control signal may be the same as the display output signal for driving the eighth row of the sub-pixel units.

In addition, in the shift register unit 10 provided by the embodiment of the present disclosure, providing the blanking coupling circuit 130 can control, by coupling, the level of the control node H, for example, the level of the control node H is pulled up, thereby allowing the first node Q to be charged more sufficiently in a blanking phase of one frame, so as to avoid the abnormal output.

It should be noted that, in the embodiments of the present disclosure, "a previous second-stage shift register unit" means a previous second shift register unit from the present-stage shift register unit, and "a next third-stage shift register unit" means a next third shift register unit from the present-stage shift register unit. The "previous" and "next" are relative, and the following embodiments are the same in this aspect and will not be repeated herein.

Figure 2:
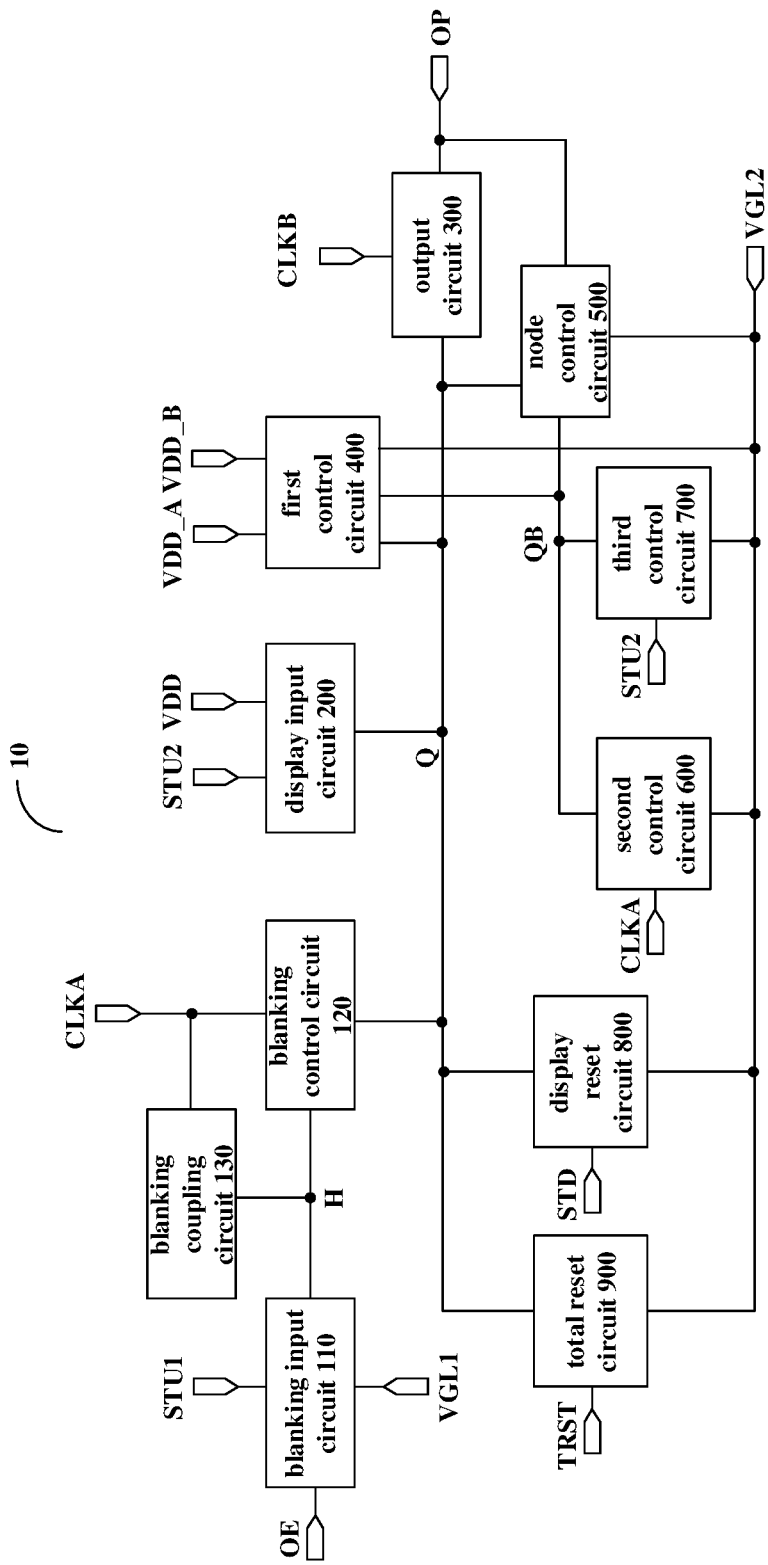
FIG. 2 is a schematic diagram of another shift register unit provided by some embodiments of the present disclosure.

In some embodiments, as illustrated in FIG. 2, the shift register unit 10 further includes a first control circuit 400, and the first control circuit 400 is configured to control a level of the second node QB under control of the level of the first node Q. For example, in one example, the first control circuit 400 is connected to a third voltage terminal VDD_A and a fifth voltage terminal VGL2.

It should be noted that, in the embodiments of the present disclosure, the fifth voltage terminal VGL2 can be configured to, for example, provide a DC low-level signal, which are the same in the following embodiments and will not be described again.

In addition, in the embodiments of the present disclosure, the second node QB is, for example, a pull-down node, that is, the pull-down node is an example of the second node QB.

For example, in a case where the level of the first node Q is at a high level, the first control circuit 400 can pull down the level of the second node QB to a low level by using the low-level fifth voltage provided by the fifth voltage terminal VGL2. For another example, in a case where the level of the first node Q is at a low level, the first control circuit 500 can charge the second node QB, by using a third voltage (for example, a high level) input from the third voltage terminal VDD_A, to pull up the level of the second node QB to a high level.

In another example, the first control circuit 400 may be further connected to a fourth voltage terminal VDD_B to receive a fourth voltage (for example, a high level). For example, the third voltage terminal VDD_A and the fourth voltage terminal VDD_B can be configured to input a high-level voltage alternately, that is, in a case where the third voltage terminal VDD_A inputs a high-level voltage, the fourth voltage terminal VDD_B inputs a low-level voltage, and in a case where the third voltage terminal VDD_A inputs a low-level voltage, the fourth voltage terminal VDD_B inputs a high-level voltage.

In some embodiments, as illustrated in FIG. 2, the shift register unit 10 further includes a node control circuit 500, and the node control circuit 500 is configured to reset the first node Q and the output terminal OP under control of the level of the second node QB. For example, in a case where the output terminal OP includes the shift signal output terminal CR and the pixel scanning signal output terminal OUT, the node control circuit 500 can reset the shift signal output terminal CR and the pixel scanning signal output terminal OUT simultaneously.

For example, the node control circuit 500 is connected to the fifth voltage terminal VGL2. In a case where the node control circuit 500 is turned on under control of the level of the second node QB, the node control circuit 500 can pull down the level of the first node Q, the level of the shift signal output terminal CR, and the level of the pixel scanning signal output terminal OUT by using the low-level fifth voltage provided by the fifth voltage terminal VGL2, thereby implementing the reset. It should be noted that, in the embodiments of the present disclosure, the fifth voltage terminal VGL2 can be configured to, for example, provide a DC low-level fifth voltage, that is, the fifth voltage is a low level, which are the same in the following embodiments and will not be described again.

In some embodiments, as illustrated in FIG. 2, the shift register unit 10 further includes a second control circuit 600, and the second control circuit 600 is configured to control the level of the second node QB in response to the first clock signal. For example, in one example, the second control circuit 600 may be connected to the first clock signal terminal CLKA to receive the first clock signal, and be further connected to the fifth voltage terminal VGL2 to receive the low-level fifth voltage. For example, during a blanking phase of one frame, the second control circuit 600 may be turned on in response to the first clock signal, so as to pull down the level of the second node QB by using the low-level fifth voltage.

In some embodiments, as illustrated in FIG. 2, the shift register unit 10 further includes a third control circuit 700, and the third control circuit 700 is configured to control the level of the second node QB in response to the display input signal. For example, the third control circuit 700 may be connected to the display input signal terminal STU2 to receive the display input signal, and be further connected to the fifth voltage terminal VGL2 to receive the low-level fifth voltage. For example, during a display phase of one frame, the third control circuit 700 may be turned on in response to the display input signal, so as to pull down the level of the second node QB by using the low-level fifth voltage. Pulling down the level of the second node QB to a low level can avoid the influence of the level of the second node QB on the level of the first node Q, thereby enabling the display input circuit 200 to charge the first node Q more sufficiently during the display phase.

It should be noted that, for the display input signal terminal STU2, reference may be made to the corresponding descriptions above, and details are not described herein again.

In some embodiments, as illustrated in FIG. 2, the shift register unit 10 further includes a display reset circuit 800, and the display reset circuit 800 is configured to reset the first node Q in response to a display reset signal. For example, in one example, the display reset circuit 800 may be connected to a display reset signal terminal STD to receive the display reset signal, and be further connected to the fifth voltage terminal VGL2 to receive the low-level fifth voltage. For example, during a display phase of one frame, the display reset circuit 800 may be turned on in response to the display reset signal, so that the level of the first node Q can be pulled down, by using the low-level fifth voltage provided by the fifth voltage terminal VGL2, to implement the reset. For example, in a case where a plurality of shift register units 10 are cascaded to form a gate driving circuit, the display reset signal terminal STD of each stage of the shift register units is electrically connected to the output terminal OP (for example, the shift signal output terminal CR) of the next third-stage shift register unit.

In some embodiments, as illustrated in FIG. 2, the shift register unit 10 further includes a total reset circuit 900, and the total reset circuit 900 is configured to reset the first node Q in response to a total reset signal. For example, in one example, the total reset circuit 900 is connected to a total reset signal terminal TRST to receive the total reset signal, and is further connected to the fifth voltage terminal VGL2 to receive the low-level fifth voltage. For example, in a case where a plurality of shift register units 10 are cascaded to form a gate driving circuit, the total reset circuit 900 in each stage of the shift register units 10 is turned on in response to the total reset signal before a display phase of one frame. Therefore, the level of the first node Q can be pulled down by using the low-level fifth voltage provided by the fifth voltage terminal VGL2 to implement the reset, thereby implementing the total reset of each stage of the shift register units 10.

It should be noted that, in the embodiments of the present disclosure, for example, the low-level signal input by the first voltage terminal VGL1, the low-level signal input by the fifth voltage terminal VGL2, and the low-level signal input by the sixth voltage terminal VGL3 can be the same, that is, the above three voltage terminals can be connected to a same signal line to receive a same low-level signal. For another example, the above three voltage terminals can be connected to different signal lines to receive different low-level signals, respectively. The embodiments of the present disclosure do not limit the manners in which the first voltage terminal VGL1, the fifth voltage terminal VGL2, and the sixth voltage terminal VGL3 are disposed.

In addition, charging a node (for example, the pull-up node H, the first node Q, the second node QB, etc.) means that, for example, electrically connecting the node to a high-level voltage signal, so that the high-level voltage signal is used to pull up the level of the node. Discharging (or resetting) a node means, for example, electrically connecting the node to a low-level voltage signal, so that the low-level voltage signal is used to pull down the level of the node. For example, a capacitor electrically connected to the node can be provided, and charging or discharging the node means charging or discharging the capacitor electrically connected to the node.

It should be understood by those skilled in the art that although the shift register unit 10 as illustrated in FIG. 2 shows the first control circuit 400, the node control circuit 500, the second control circuit 600, the third control circuit 700, the display reset circuit 800 and the total reset circuit 900, the above examples do not limit the protection scope of the present disclosure. In a practical application, those skilled in the art can select one or more of the above circuits according to a situation, and various combinations based on the above various circuits are not deviated from the principle of the present disclosure. Details are not described herein again.

Figure 3:
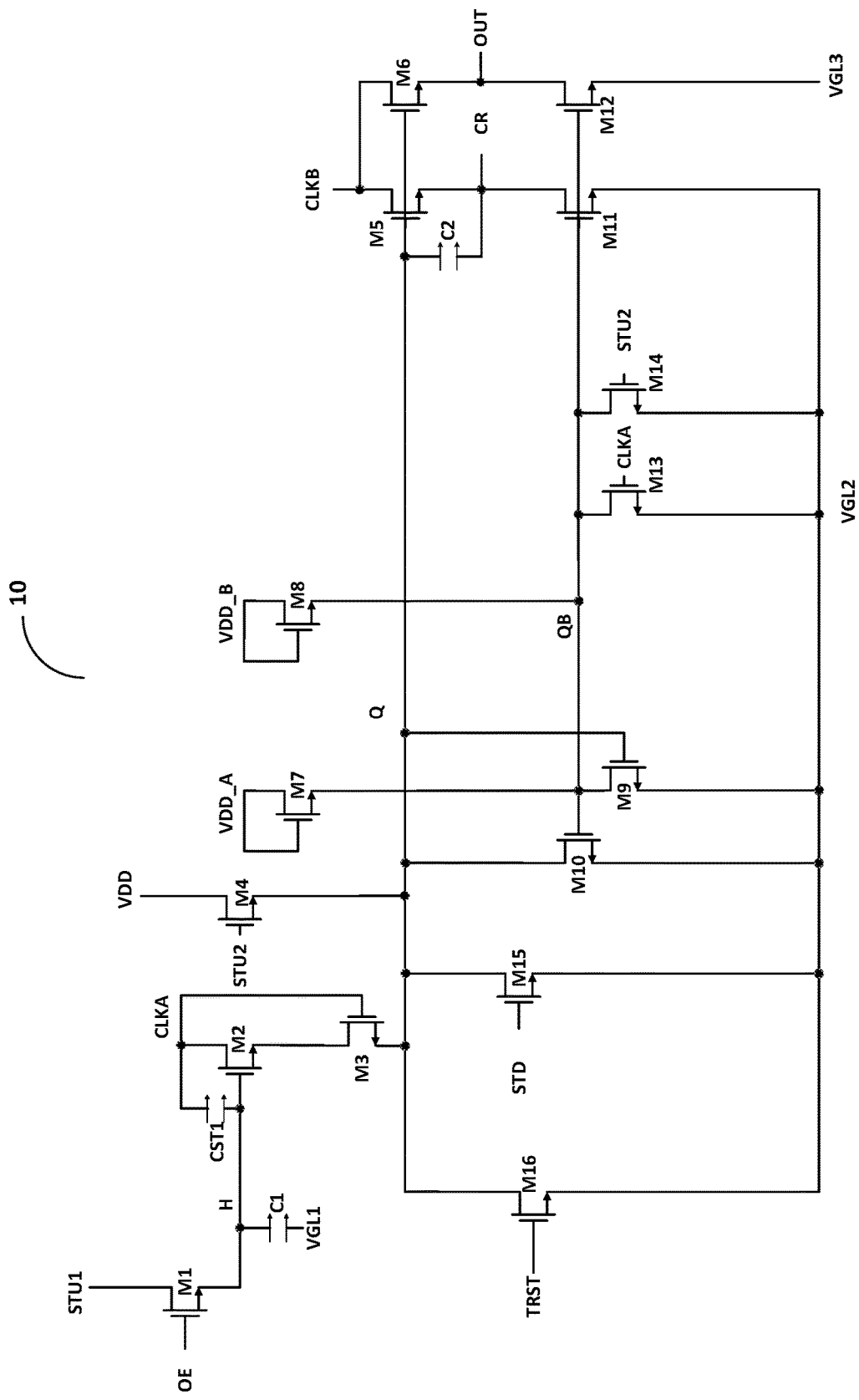
FIG. 3 is a circuit diagram of a shift register unit provided by some embodiments of the present disclosure.

In some embodiments of the present disclosure, the shift register unit 10 as illustrated in FIG. 2 can be implemented as the circuit structure as illustrated in FIG. 3. As illustrated in FIG. 3, the shift register unit 10 includes: first to sixteenth transistors M1-M16, a first capacitor C1, a second capacitor C2, and a first coupling capacitor CST1. The output terminal OP includes the shift signal output terminal CR and the pixel scanning signal output terminal OUT, and both the shift signal output terminal CR and the pixel scanning signal output terminal OUT can output the composite output signal. It should be noted that all the transistors as illustrated in FIG. 3 are described by taking a N-type transistor as an example.

As illustrated in FIG. 3, the blanking input circuit 110 may be implemented to include a first transistor M1 and a first capacitor C1. A gate electrode of the first transistor M1 is connected to the compensation selection control terminal OE to receive the compensation selection control signal. A first electrode of the first transistor M1 is connected to the blanking input signal terminal STU1 to receive the blanking input signal. A second electrode is connected to the control node H. For example, in a case where the compensation selection control signal is a high-level turn-on signal, the first transistor M1 is turned on, so that the control node H can be charged by using the blanking input signal.

A first electrode of the first capacitor C1 is connected to the control node H, and a second electrode of the first capacitor C1 is connected to the first voltage terminal VGL1. The first capacitor C1 can be used to maintain the level of the control node H, for example, during a display phase of one frame, the blanking input circuit 110 charges the control node H to a high level, and the first capacitor C1 can maintain the high level of the control node H to a blanking phase of the frame. It should be noted that, in the embodiment of the present disclosure, in addition to being connected to the first voltage terminal VGL1, the second electrode of the first capacitor C1 can also be connected to other voltage terminals that provide a constant level. For example, the second electrode of the first capacitor C1 is grounded and the embodiments of the present disclosure are not limited thereto.

As illustrated in FIG. 3, the blanking control circuit 120 may be implemented to include a second transistor M2 and a third transistor M3. A gate electrode of the second transistor M2 is connected to the control node H. A first electrode of the second transistor M2 is connected to the first clock signal terminal CLKA to receive the first clock signal. A second electrode of the second transistor M2 is connected to a first electrode of the third transistor M3. A gate electrode of the third transistor M3 is connected to the first clock signal terminal CLKA to receive the first clock signal, and a second electrode of the third transistor M3 is connected to the first node Q. For example, during a blanking phase of one frame, the second transistor M2 is turned on under control of the level of the control node H. When the first clock signal is at a high level, the third transistor M3 is turned on under control of the first clock signal, so that the high-level first clock signal can charge the first node Q through the second transistor M2 and the third transistor M3.

As illustrated in FIG. 3, the blanking coupling circuit 130 may be implemented as the first coupling capacitor CST1. A first electrode of the first coupling capacitor CST1 is connected to the first clock signal terminal CLKA to receive the first clock signal, and a second electrode of the first coupling capacitor CST1 is connected to the control node H. For example, when the first clock signal changes from a low level to a high level, the first clock signal can control, by coupling, the level of the control node H through the coupling effect of the first coupling capacitor CST1, for example, causing the level of the control node H to be further pulled up.

Figure 4:
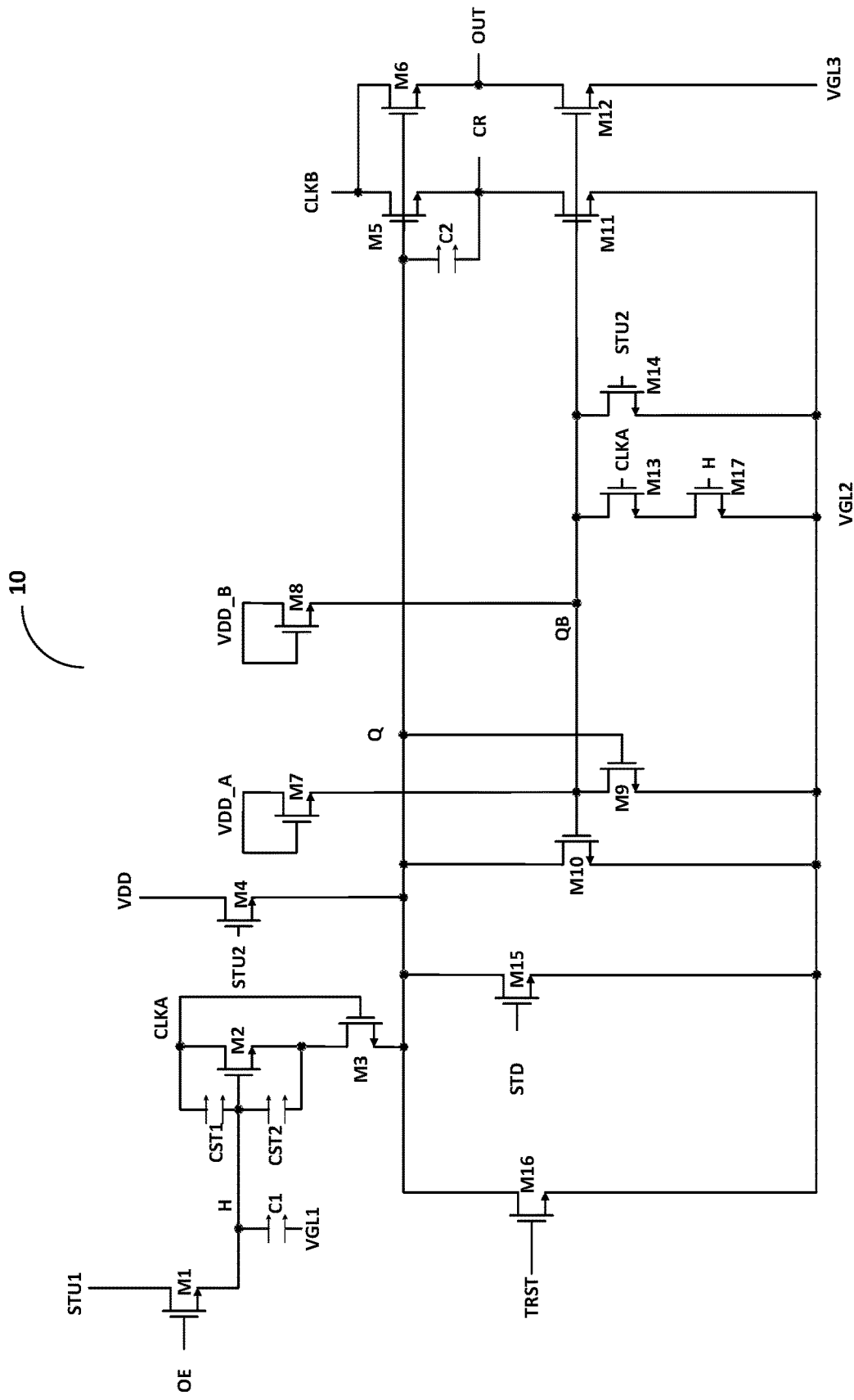
FIG. 4 is a circuit diagram of another shift register unit provided by some embodiments of the present disclosure.

For example, in some other embodiments, as illustrated in FIG. 4, the blanking coupling circuit 130 may include a second coupling capacitor CST2 in addition to the first coupling capacitor CST1. A first electrode of the second coupling capacitor CST2 is connected to the second electrode of the second transistor M2, and a second electrode of the second coupling capacitor CST2 is connected to the control node H. For example, when the first clock signal changes from a low level to a high level, if the second transistor M2 is turned on at this time, the high-level first clock signal can be transmitted to the first electrode of the second coupling capacitor CST2 through the second transistor M2, which can cause the level of the first electrode of the second coupling capacitor CST2 to be pulled up, and the level of the control node H can be further pulled up by the bootstrap effect of the second coupling capacitor CST2.

In the shift register unit 10 provided by the embodiment of the present disclosure, providing the blanking coupling circuit 130 can control, by coupling, the level of the control node H, for example, the level of the control node H can be pulled up, so that the control node H is prevented from leaking, and for example, the first node Q is charged more sufficiently in a blanking phase of one frame to avoid the output abnormality of the shift register unit 10.

As illustrated in FIG. 3, the display input circuit 200 may be implemented as a fourth transistor M4. A gate electrode of the fourth transistor M4 is connected to the display input signal terminal STU2 to receive the display input signal. A first electrode of the fourth transistor M4 is connected to the second voltage terminal VDD to receive the second voltage, and a second electrode of the fourth transistor M4 is connected to the first node Q. For example, during a display phase of one frame, the fourth transistor M4 is turned on under control of the display input signal, so that the first node Q can be charged by using the second voltage.

Figure 5A:
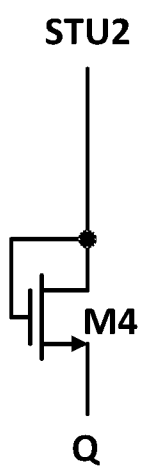
FIG. 5A and FIG. 5B are two examples of the display input circuit provided by some embodiments of the present disclosure.

For example, in an example, as illustrated in FIG. 5A, the gate electrode and the first electrode of the fourth transistor M4 may also be connected to the display input signal terminal STU2 simultaneously, so that when the display input signal is at a high level, the first node Q can be charged by using the high-level display input signal.

Figure 5B:
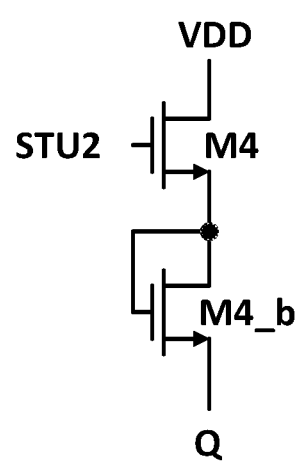

For another example, as illustrated in FIG. 5B, in addition to the fourth transistor M4, the display input circuit 200 further includes a transistor M4_b, a gate electrode of the transistor M4_b and a first electrode of the transistor M4_b are connected to the second electrode of the fourth transistors M4, and a second electrode of the transistor M4_b is connected to the first node Q. Because the transistor M4_b adopts a diode connection, the current can only flow from the first electrode of the transistor M4_b to the second electrode of the transistor M4_b, and cannot flow from the second electrode of the transistor M4_b (that is, the first node Q) to the first electrode of the transistor M4_b, thereby preventing the first node Q from leaking through the fourth transistor M4.

As illustrated in FIG. 3, the output circuit 300 may be implemented to include a fifth transistor M5, a sixth transistor M6, and a second capacitor C2. A gate electrode of the fifth transistor M5 is connected to the first node Q. A first electrode of the fifth transistor M5 is connected to the second clock signal terminal CLKB to receive the second clock signal, the second clock signal is used as the composite output signal, and a second electrode of the transistor M5 is connected to the shift signal output terminal CR. A gate electrode of the sixth transistor M6 is connected to the first node Q, a first electrode of the sixth transistor M6 is connected to the second clock signal terminal CLKB to receive the second clock signal, the second clock signal is used as the composite output signal, and a second electrode of the sixth transistor M6 is connected to the pixel scanning signal output terminal OUT. A first electrode of the second capacitor C2 is connected to the first node Q, and a second electrode of the capacitor C2 is connected to the second electrode of the fifth transistor M5. For example, when the level of the first node Q is a high level, the fifth transistor M5 and the sixth transistor M6 are turned on, so that the second clock signal can be output as the composite output signal to the shift signal output terminal CR and the pixel scanning signal output terminal OUT.

As illustrated in FIG. 3, the first control circuit 400 may be implemented to include a seventh transistor M7, an eighth transistor M8, and a ninth transistor M9. A gate electrode of the seventh transistor M7 is connected to a first electrode of the seventh transistor M7, and is configured to be connected to the third voltage terminal VDD_A to receive the third voltage, and a second electrode of the seventh transistor M7 is connected to the second node QB. A gate electrode of the eighth transistor M8 is connected to a first electrode of the eighth transistor M8, and is configured to be connected to the fourth voltage terminal VDD_B to receive the fourth voltage, and a second electrode of the eighth transistor M8 is connected to the second node QB. A gate electrode of the ninth transistor M9 is connected to the first node Q, a first electrode of the ninth transistor M9 is connected to the second node QB, and a second electrode of the ninth transistor M9 is connected to the fifth voltage terminal VGL2 to receive the fifth voltage.

For example, the third voltage terminal VDD_A and the fourth voltage terminal VDD_B can be configured to alternately input a high-level voltage, that is, in a case where the third voltage terminal VDD_A inputs a high-level voltage, the fourth voltage terminal VDD_B inputs a low-level voltage, and in a case where the third voltage terminal VDD_A inputs a low-level voltage, the fourth voltage terminal VDD_B inputs a high-level voltage. That is, only one of the seventh transistor M7 and the eighth transistor M8 is in a turn-on state, which can avoid performance drift caused by long-term turn-on of the transistor. In a case where the seventh transistor M7 or the eighth transistor M8 is turned on, the third voltage or the fourth voltage can charge the second node QB, thereby pulling up the level of the second node QB to a high level. In a case where the level of the first node Q is a high level, the ninth transistor M9 is turned on. For example, in the design of the transistor, the ninth transistor M9 and the seventh transistor M7 (or the eighth transistor M8) can be configured that (for example, the size ratio, the threshold voltage, etc.) in a case where both the ninth transistor M9 and the seventh transistor M7 (or the eighth transistor M8) are turned on, the level of the second node QB can be pulled down to a low level, which can cause the tenth transistor M10, the eleventh transistor M11 and the twelfth transistor M12 to maintain being turned off.

As illustrated in FIG. 3, the node control circuit 500 may be implemented to include a tenth transistor M10, an eleventh transistor M11, and a twelfth transistor M12. A gate electrode of the tenth transistor M10 is connected to the second node QB, a first electrode of the tenth transistor M10 is connected to the first node Q, and a second electrode of the tenth transistor M10 is connected to the fifth voltage terminal VGL2 to receive the fifth voltage. A gate electrode of the eleventh transistor M11 is connected to the second node QB, a first electrode of the eleventh transistor M11 is connected to the shift signal output terminal CR, and a second electrode of the eleventh transistor M11 is connected to the fifth voltage terminal VGL2 to receive the fifth voltage. A gate electrode of the twelfth transistor M12 is connected to the second node QB, a first electrode of the twelfth transistor M12 is connected to the pixel scanning signal output terminal OUT, and a second electrode of the twelfth transistor M12 is connected to the sixth voltage terminal VGL3 to receive the sixth voltage. It should be noted that, in the embodiments of the present disclosure, the sixth voltage terminal VGL3 can be configured to, for example, provide a DC low-level signal, that is, the sixth voltage is a low level, which are the same in the following embodiments and will not be described again.

For example, when the level of the second node QB is at a high level, the tenth transistor M10, the eleventh transistor M11, and the twelfth transistor M12 are turned on, so that the level of the first node Q, the level of the shift signal output terminal CR, and the level of the pixel scanning signal output terminal OUT can be pulled down to reduce noise by using the low-level fifth voltage and the low-level sixth voltage.

As illustrated in FIG. 3, the second control circuit 600 may be implemented as a thirteenth transistor M13. A gate electrode of the thirteenth transistor M13 is connected to the first clock signal terminal CLKA to receive the first clock signal, a first electrode of the thirteenth transistor M13 is connected to the second node QB, and a second electrode of the thirteenth transistor M13 is connected to the fifth voltage terminal VGL2 to receive the fifth voltage. For example, during a blanking phase of one frame, when the first clock signal is at a high level, the thirteenth transistor M13 is turned on, so that the second node QB can be pulled down by using the low-level fifth voltage.

For example, in another example, as illustrated in FIG. 4, the second control circuit 600 further includes a seventeenth transistor M17. A gate electrode of the seventeenth transistor M17 is electrically connected to the control node H, a first electrode of the seventeenth transistor M17 is connected to the second electrode of the thirteenth transistor M13, and a second electrode of the seventeenth transistor M17 is connected to the fifth voltage terminal VGL2 to receive the fifth voltage.

For example, during a blanking phase of one frame, when the first clock signal and the control node H are both at a high level, the thirteenth transistor M13 and the seventeenth transistor M17 are both turned on, so that the second node QB is electrically connected to the fifth voltage terminal VGL2, and the level of the second node QB can be pulled down to a low level by using the low-level fifth voltage.

For example, a plurality of shift register units 10 as illustrated in FIG. 4 can be cascaded to form a gate driving circuit, and the gate driving circuit can implement the random compensation. For example, during a blanking phase of one frame, the external compensation is needed to perform on the fifth row of sub-pixel units, then the control node H corresponding to the fifth row of the shift register units 10 is at a high level (in a case where the clock signals overlap, the control node H corresponding to the sixth row of the shift register units 10 is also at a high level), so that the level of the second node QB in the shift register unit 10 is pulled down, which does not affect the normal output of the shift register unit 10. However, the level of the control node H corresponding to the other rows of the shift register units 10 is at a low level, so that the level of the second node QB in the shift register unit 10 is not pulled down to prevent the shift signal output terminal CR and the pixel scanning signal output terminal OUT of the other rows of the shift register units 10 from being in a floating state, and the noise at the shift signal output terminal CR and the pixel scanning signal output terminal OUT can be reduced.

As illustrated in FIG. 3, the third control circuit 700 may be implemented as a fourteenth transistor M14. A gate electrode of the fourteenth transistor M14 is connected to the display input signal terminal STU2 to receive the display input signal, a first electrode of the fourteenth transistor M14 is connected to the second node QB, and a second electrode of the fourteenth transistor M14 is connected to the fifth voltage terminal VGL2 to receive the fifth voltage. For example, in a display phase of one frame, the fourteenth transistor M14 may be turned on in response to the display input signal, so that the level of the second node QB can be pulled down by using the low-level fifth voltage. Pulling down the level of the second node QB to a low level can avoid the influence of the level of the second node QB on the level of the first node Q, thereby allowing the first node Q to be charged more sufficiently by the fourth transistor M4 in the display phase.

For example, in a case where a plurality of the shift register units 10 are cascaded to form a gate driving circuit, the display input signal terminal STU2 of each stage of the shift register units may be electrically connected to the shift signal output terminal CR of a previous second-stage shift register unit. That is, the display input signal may be a signal output from the shift signal output terminal CR of the previous second-stage shift register unit.

As illustrated in FIG. 3, the display reset circuit 800 may be implemented as a fifteenth transistor M15. A gate electrode of the fifteenth transistor M15 is connected to the display reset signal terminal STD to receive the display reset signal, a first electrode of the fifteenth transistor M15 is connected to the first node Q, and a second electrode of the fifteenth transistor M15 is connected to the fifth voltage terminal VGL2 to receive the fifth voltage. For example, in a display phase of one frame, the fifteenth transistor M15 may be turned on in response to the display reset signal, so that the level of the first node Q can be pulled down to implement the reset by using the low-level fifth voltage. For example, in a case where a plurality of shift register units 10 are cascaded to form a gate driving circuit, the display reset signal terminal STD of each stage of the shift register units may be electrically connected to the shift signal output terminal CR of a next third-stage shift register unit. That is, the display reset signal may be a signal output from the shift signal output terminal CR of the next third-stage shift register unit.

As illustrated in FIG. 3, the total reset circuit 900 may be implemented as a sixteenth transistor M16. A gate electrode of the sixteenth transistor M16 is connected to the total reset signal terminal TRST to receive the total reset signal. A first electrode of the sixteenth transistor M16 is connected to the first node Q. A second electrode of the sixteenth transistor M16 is connected to the fifth voltage terminal VGL2 to receive the fifth voltage. For example, in a case where a plurality of shift register units 10 are cascaded to form a gate driving circuit, before a display phase of one frame, the sixteenth transistor M16 in each stage of the shift register units 10 is turned on in response to the total reset signal, so that the level of the first node Q can be pulled down to implement the reset by using the low-level fifth voltage, and the total reset of each stage of the shift register units 10 is implemented.

Figure 7:
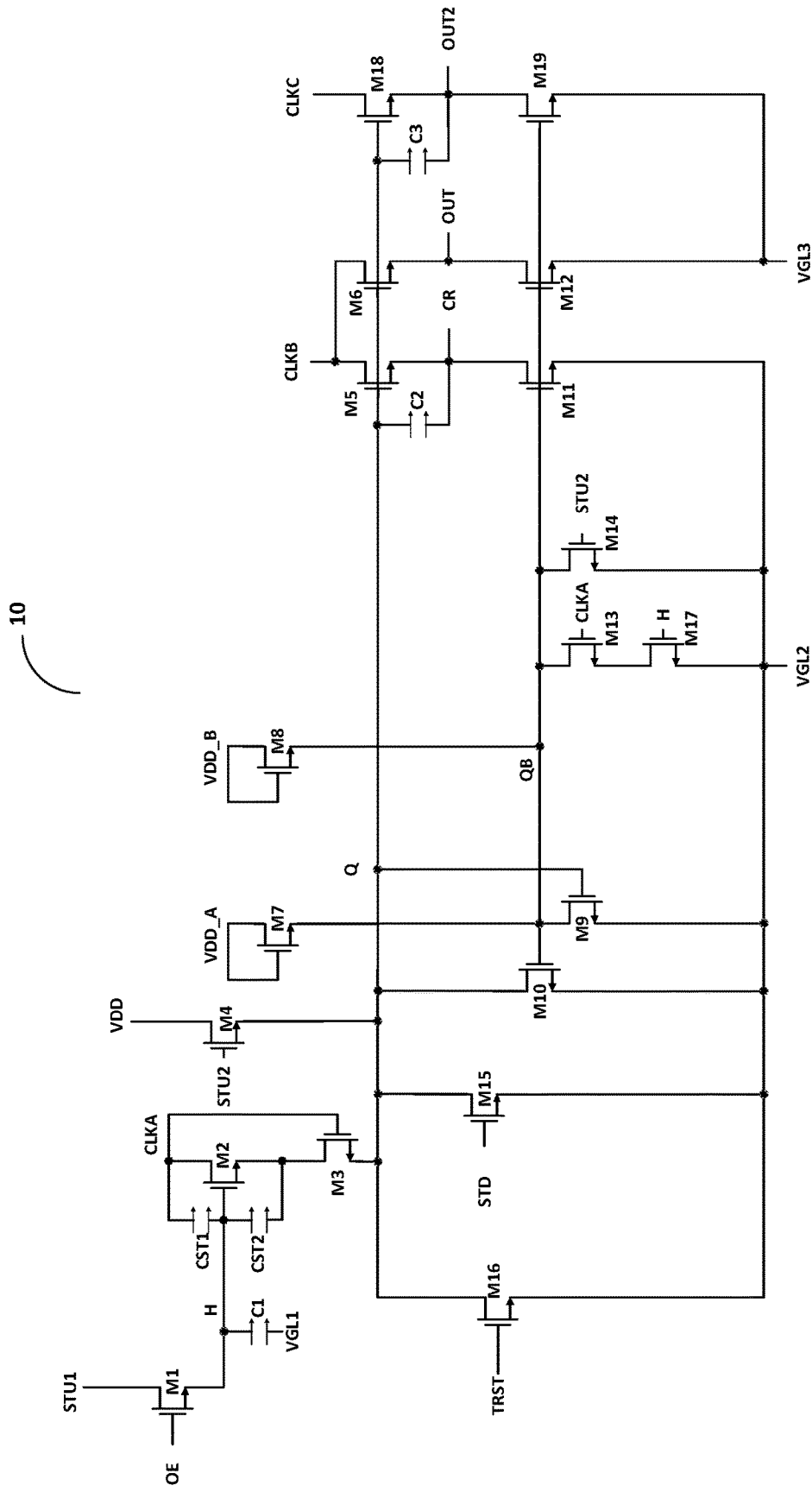
FIG. 7 is a circuit diagram of further still another shift register unit provided by some embodiments of the present disclosure.

As illustrated in FIG. 7, some embodiments of the present disclosure further provide a shift register unit 10. Compared the shift register unit 10 illustrated in FIG. 7 with the shift register unit 10 illustrated in FIG. 4, the output circuit 300 further includes an eighteenth transistor M18 and a third capacitor C3. Accordingly, the node control circuit 500 further includes a nineteenth transistor M19.

As illustrated in FIG. 7, a gate electrode of the eighteenth transistor M18 is connected to the first node Q, a first electrode of the eighteenth transistor M18 is connected to the third clock signal terminal CLKC to receive the third clock signal, and a second electrode of the eighteenth transistor M18 is connected to another pixel scanning signal output terminal OUT2. A first electrode of the third capacitor C3 is connected to the first node Q, and a second electrode of the third capacitor C3 is connected to the second electrode of the eighteenth transistor M18. For example, when the level of the first node Q is at a high level, the eighteenth transistor M18 is turned on, thereby outputting the third clock signal to the pixel scanning signal output terminal OUT2. For example, in some embodiments, the third clock signal input from the third clock signal terminal CLKC may be configured to be the same as the second clock signal input from the second clock signal terminal CLKB; and for another example, in some other embodiments, the third clock signal can be further configured to be different from the second clock signal, so that the two pixel scanning signal output terminals OUT and OUT2 can respectively output different signals, thereby improving the driving capability of the shift register unit 10 and increasing the diversity of output signals.

It should be noted that in some embodiments, the holding capability of the level of the first node Q can be improved by providing the third capacitor C3. Of course, the third capacitor C3 may not be provided, and the embodiments of the present disclosure do not limit this.

As illustrated in FIG. 7, a gate electrode of the nineteenth transistor M19 is connected to the second node QB, a first electrode of the nineteenth transistor M19 is connected to the pixel scanning signal output terminal OUT2, and a second electrode of the nineteenth transistor M19 is connected to the sixth voltage terminal VGL3. For example, in a case where the level of the second node QB is at a high level, the nineteenth transistor M19 is turned on, so that the level of the pixel scanning signal output terminal OUT2 can be pulled down to implement the reset by using the low-level sixth voltage. It should be noted that, the second electrode of the nineteenth transistor M19 can be further configured to be connected to other signal terminals, as long as the pixel scanning signal output terminal OUT2 can be pulled down and reset, which is not limited in the embodiments of the present disclosure.

Although only the examples in which the shift register unit includes two or three output terminals are shown above, those skilled in the art should understand that according to the description of the present disclosure, more output terminals can be provided according to practical conditions, and the above examples should not constitute the limit to the protection scope of the present disclosure.

As described above, in the shift register units 10 provided by the embodiments of the present disclosure, the level of the control node H can be maintained by the first capacitor C1, and the level of the first node Q can be maintained by the second capacitor C2. The first capacitor C1 and/or the second capacitor C2 may be a capacitor component fabricated by a manufacturing process, for example, by fabricating a dedicated capacitor electrode. Each electrode of the capacitor may be implemented by a metal layer, a semiconductor layer (e.g., doped polysilicon) and the like. And in some examples, by designing circuit wiring parameters, the first capacitor C1 and/or the second capacitor C2 can be further implemented by parasitic capacitance between the various components. The connection manner of the first capacitor C1 and/or the second capacitor C2 is not limited to the manner described above, and may be other suitable connection manners as long as the level provided to the control node H or the first node Q can be stored.

In a case where the first node Q and/or the control node H is maintained at a high level, the first electrodes of some transistors (for example, the first transistor M1, the third transistor M3, the tenth transistor M10, the fifteenth transistor M15, and the sixteenth transistor M16) are connected to the first node Q or the control node H, and the second electrodes thereof are connected to receive low level signals. Even in a case where the gate electrodes of these transistors are input with turn-off signals, because there is a voltage difference between the first electrode and the second electrode, leakage current may occur, thereby causing the effect of maintaining the level of the first node Q and/or the control node H in the shift register unit 10 to get worse.

For example, as illustrated in FIG. 4, taking the control node H as an example, the first electrode of the first transistor M1 is connected to the blanking input signal terminal STU1, and the second electrode of the first transistor M1 is connected to the control node H. In a case where the control node H is at a high level and the signal input by the blanking input signal terminal STU1 is at a low level, the control node H may leak current through the first transistor M1.

Figure 8:
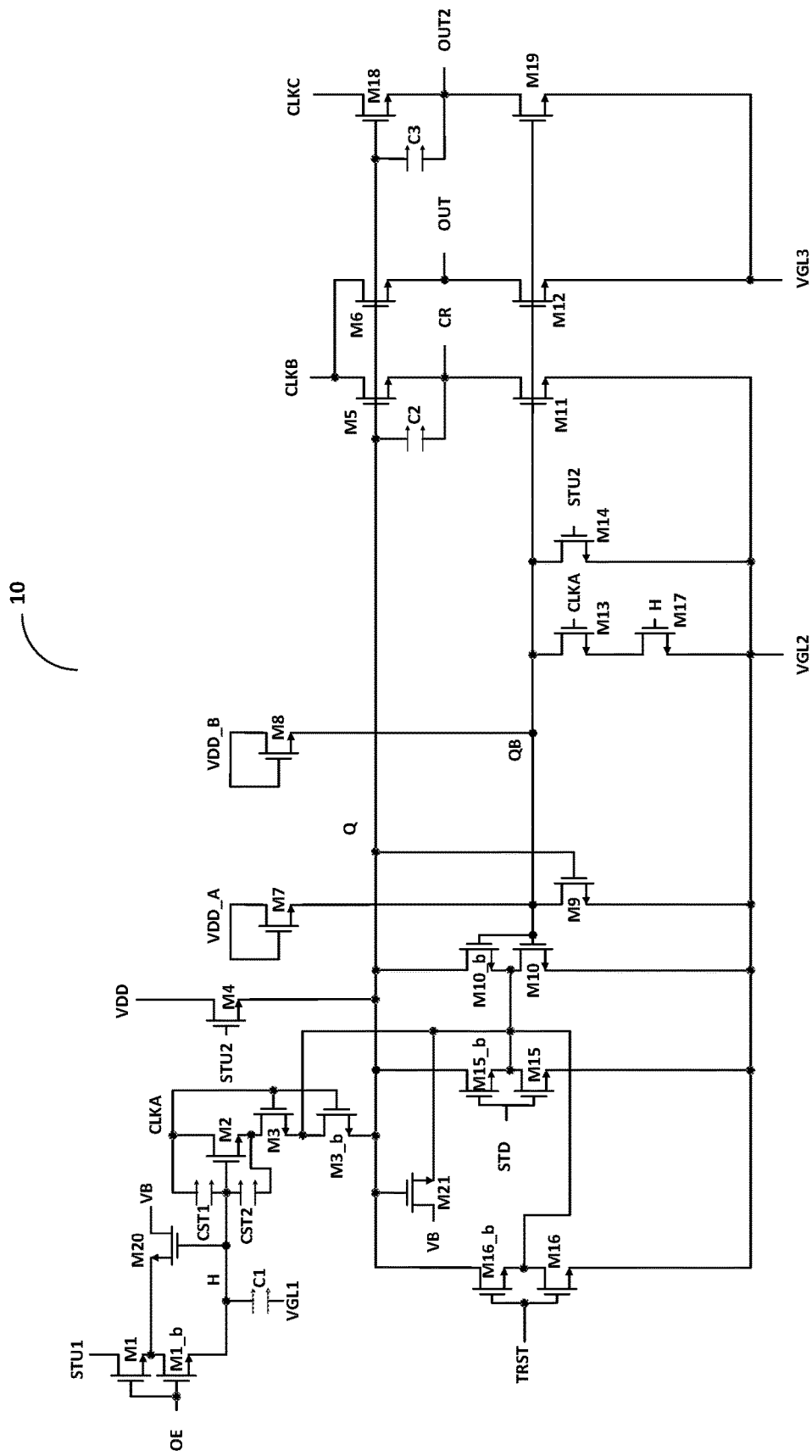
FIG. 8 is a circuit diagram of further still another shift register unit provided by some embodiments of the present disclosure.

In response to the above problems, as illustrated in FIG. 8, some embodiments of the present disclosure provide a shift register unit 10 with a leakage preventing structure. The differences between the shift register unit 10 in FIG. 8 and the shift register unit 10 in FIG. 4 are a first leakage preventing transistor M1_b, a third leakage preventing transistor M3_b, a tenth leakage preventing transistor M10_b, a fifteenth leakage preventing transistor M15_b, a sixteenth leakage preventing transistor M16_b, a twentieth transistor M20, and a twenty-first M21 are added. In the following, the first leakage preventing transistor M1_b will be taken as an example to describe the working principle of leakage prevention.

A gate electrode of the first leakage preventing transistor M1_b is connected to the gate electrode of the first transistor M1, a first electrode of the first leakage preventing transistor M1_b is connected to a second electrode of the twentieth transistor M20, and a second electrode of the first leakage preventing transistor M1_b is connected to the control node H. A gate electrode of the twentieth transistor M20 is connected to the control node H, and a first electrode of the twentieth transistor M20 is connected to a seventh voltage terminal VB to receive a high-level seventh voltage. In a case where the control node H is at a high level, the twentieth transistor M20 is turned on under control of the level of the control node H, so that the high-level signal input by the seventh voltage terminal VB can be input to the first electrode of the first leakage preventing transistor M1_b, and cause both the first electrode of the first leakage preventing transistor M1_b and the second electrode of the first leakage preventing transistor M1_b to be at a high level, so that the control node H can be prevented from leaking through the first leakage preventing transistor M1_b. At that time, because the gate electrode of the first leakage preventing transistor M1_b and the gate electrode of the first transistor M1 are connected, the combination of the first transistor M1 and the first leakage preventing transistor M1_b can implement the same effect as the first transistor M1 described above and simultaneously can have an effect of preventing leakage.

Similarly, the third leakage preventing transistor M3_b, the tenth leakage preventing transistor M10_b, the fifteenth leakage preventing transistor M15_b, and the sixteenth leakage preventing transistor M16_b can implement the leakage preventing structure in combination with the twenty-first M21, respectively, thereby preventing the first node Q from leaking. The working principle of preventing leakage at the first node Q is the same as the working principle of preventing leakage at the control node H described above, and details are not described herein again.

Figure 9:
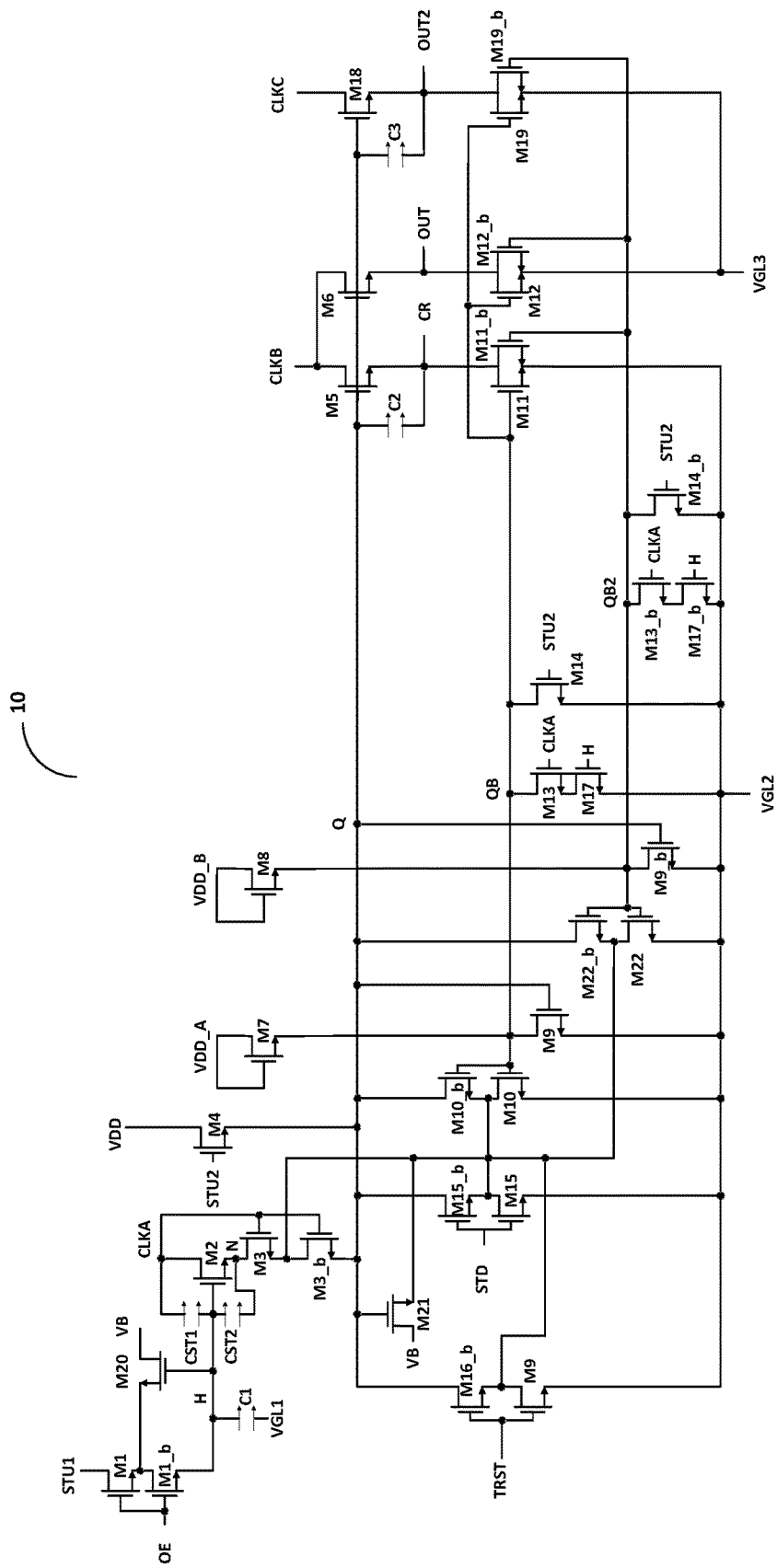
FIG. 9 is a circuit diagram of further still another shift register unit provided by some embodiments of the present disclosure.
Figure 10:
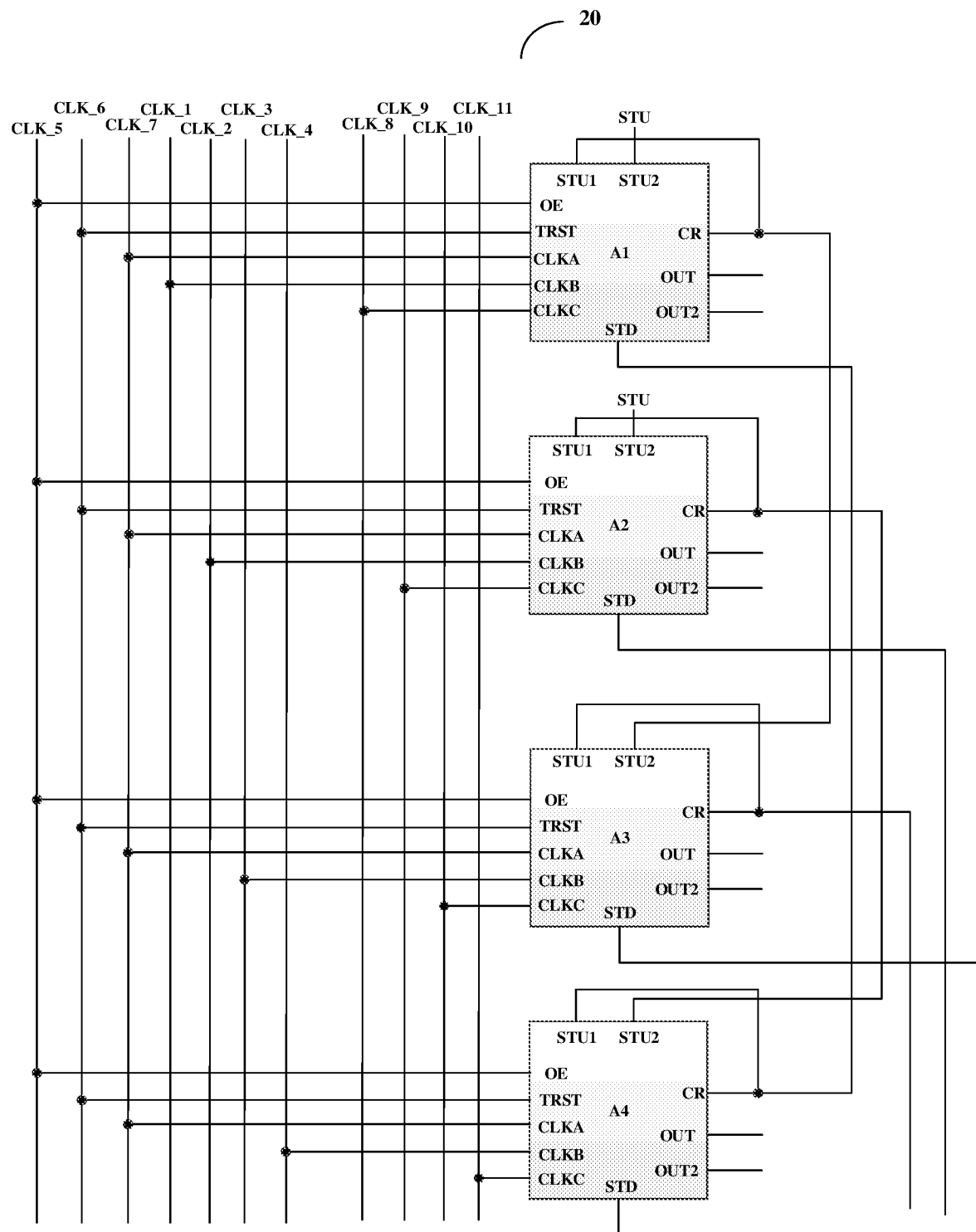
FIG. 10 is a schematic diagram of a gate driving circuit provided by some embodiments of the present disclosure.

As illustrated in FIG. 9, some other embodiments of the present disclosure further provide another shift register unit 10. Compared the shift register unit 10 as illustrated in FIG. 10 with the shift register unit 10 as illustrated in FIG. 8, a third node QB2 is added. In order to work with the third node QB2, transistors M22, M22_b, M9_b, M13_b, M17_b, M14_b, M11_b, M12_b, and M19_b are added accordingly. It should be noted that the second electrode of the eighth transistor M8 is no longer connected to the second node QB, but is connected to the third node QB2. The transistor M22_b is a leakage preventing transistor provided to prevent the first node Q from leaking.

It should be noted that, in the embodiments of the present disclosure, the third node QB2 is, for example, a second pull-up node, that is, the second pull-up node is an example of the third node QB2.

In the shift register unit as illustrated in FIG. 9, the working principles of the transistors M22, M22_b, and M9_b are respectively similar to the working principles of the transistors M10, M10_b, and M9. The working principles of the transistors M13_b, M17_b, and M14_b are respectively similar to the working principles of the transistors M13, M17, and M14. The working principles of the transistors M11_b, M12_b, and M19_b are respectively similar to the working principles of the transistors M11, M12, and M19, and details are not described herein again.

In the shift register unit 10 provided by the embodiment of the present disclosure, by providing the third node QB2 and the corresponding transistors, the performance of the shift register unit 10 can be further improved. For example, when charging the first node Q, the level of the second node QB and the level of the third node QB2 can be better at a low level, so as not to affect the level of the first node Q, and to ensure the charging of the fourth transistor M4 more sufficient. For another example, in a case where the shift register unit 10 does not need to output, the noises of the first node Q and the output terminals (CR, OUT, OUT2) can be further reduced to avoid the abnormal output of the shift register unit 10.

It should be noted that each of the transistors used in the embodiments of the present disclosure may be a thin film transistor, a field effect transistor or other switching component having the same characteristics. In the embodiments of the present disclosure, the thin film transistor is taken as an example for description. The source electrode and drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode. In addition, the transistors can be divided into N-type and P-type transistors according to the characteristics of the transistors. In a case where the transistor is the P-type transistor, the turn-on voltage is a low level voltage (e.g., 0V, −5V, −10V, or other suitable voltage), and the turn-off voltage is a high level voltage (e.g., 5V, 10V, or other suitable voltage). In a case where the transistor is the N-type transistor, the turn-on voltage is a high level voltage (for example, 5V, 10V or other suitable voltage), and the turn-off voltage is a low level voltage (for example, 0V, −5V, −10V or other suitable voltage).

In addition, it should be noted that the transistors used in the shift register unit 10 provided by the embodiments of the present disclosure are all described by taking the N-type transistor as an example. The embodiments of the present disclosure include but are not limited thereto, and for example, at least some of the transistors in the shift register unit 10 may also use the P-type transistor.

Some embodiments of the present disclosure further provide a gate driving circuit 20. As illustrated in FIG. 10, the gate driving circuit 20 includes a plurality of cascaded shift register units 10, and any one or more of the shift register units 10 can use the structure of the shift register unit 10 provided by the embodiment of the present disclosure or a modification thereof. It should be noted that only the first four shift register units (A1, A2, A3, and A4) of the gate driving circuit 20 are schematically illustrated in FIG. 10.

As illustrated in FIG. 10, the gate driving circuit 20 further includes a first sub-clock signal line CLK_1, a second sub-clock signal line CLK_2, a third sub-clock signal line CLK_3, and a fourth sub-clock signal line CLK_4. A (4n−3)th-stage shift register unit is connected to the first sub-clock signal line CLK_1 to receive the second clock signal, and for example, the (4n−3)th-stage shift register unit is connected to the first sub-clock signal line CLK_1 through the second clock signal terminal CLKB. A (4n−2)th-stage shift register unit is connected to the second sub-clock signal line CLK_2 to receive the second clock signal, and for example, the (4n−2)th-stage shift register unit is connected to the second sub-clock signal line CLK_2 through the second clock signal terminal CLKB. A (4n−1) th-stage shift register unit is connected to the third sub-clock signal line CLK_3 to receive the second clock signal, and for example, the (4n−1)th-stage shift register unit is connected to the third sub-clock signal line CLK_3 through the second clock signal terminal CLKB. A (4n)th-stage shift register unit is connected to the fourth sub-clock signal line CLK_4 to receive the second clock signal, for example, the (4n)th-stage shift register unit is connected to the fourth sub-clock signal line CLK_4 through the second clock signal terminal CLKB, and n is an integer greater than zero.

As described above, the gate driving circuit provided by the embodiment of the present disclosure may adopt a 4CLK clock signal, so that the signal waveforms output by the adjacent shift register units in the gate driving circuit may overlap, for example, thereby increasing pre-charging time. The embodiment of the present disclosure does not limit the type of the clock signal, for example, clock signal such as 6CLK, 8CLK, etc. may also be adopted.

As illustrated in FIG. 10, the gate driving circuit 20 further includes an eighth sub-clock signal line CLK_8, a ninth sub-clock signal line CLK_9, a tenth sub-clock signal line CLK_10, and an eleventh sub-clock signal line CLK_11. In a case where the shift register unit 10 is connected to the third clock signal terminal CLKC, the (4n−3)th-stage shift register unit is connected to the eighth sub-clock signal line CLK_8 to receive the third clock signal, and for example, the (4n−3)th-stage shift register unit is connected to the eighth sub-clock signal line CLK_8 through the third clock signal terminal CLKC. The (4n−2)th-stage shift register unit is connected to the ninth sub-clock signal line CLK_9 to receive the third clock signal, and for example, the (4n−2)th-stage shift register unit is connected to the ninth sub-clock signal line CLK_9 through the third clock signal terminal CLKC. The (4n−1)th-stage shift register unit is connected to the tenth sub-clock signal line CLK_10 to receive the third clock signal, and for example, the (4n−1)th-stage shift register unit is connected to the tenth sub-clock signal line CLK_10 through the third clock signal terminal CLKC. The (4n)th-stage shift register unit is connected to the eleventh sub-clock signal line CLK_11 to receive the third clock signal, for example, the (4n)th-stage shift register unit is connected to the eleventh sub-clock signal line CLK_11 through the third clock signal terminal CLKC, and n is an integer greater than zero.

As illustrated in FIG. 10, the gate driving circuit 20 further includes a fifth sub-clock signal line CLK_5, a sixth sub-clock signal line CLK_6, and a seventh sub-clock signal line CLK_7. In a case where the shift register unit 10 is connected to the compensation selection control terminal OE, the total reset signal terminal TRST, and the first clock signal terminal CLKA, each stage of the shift register units is connected to the fifth sub-clock signal line CLK_5 to receive the compensation selection control signal, and for example, each stage of the shift register units is connected to the fifth sub-clock signal line CLK_5 through the compensation selection control terminal OE. Each stage of the shift register units is connected to the sixth sub-clock signal line CLK_6 to receive the total reset signal, and for example, each stage of the shift register units is connected to the sixth sub-clock signal line CLK_6 through the total reset signal terminal TRST. Each stage of the shift register units is connected to the seventh sub-clock signal line CLK_7 to receive the first clock signal, and for example, each stage of the shift register units is connected to the seventh sub-clock signal line CLK_7 through the first clock signal terminal CLKA.

As illustrated in FIG. 10, the display input signal terminal STU2 of each stage of the shift register units is connected to the shift signal output terminal CR of the previous second-stage shift register unit, the blanking input signal terminal STU1 of each stage of the shift register units is connected to the shift signal output terminal CR of the present-stage shift register unit, and the display reset signal terminal STD of each stage of the shift register units is connected to the shift signal output terminal CR of the next third-stage shift register unit.

It should be noted that the cascade relationship as illustrated in FIG. 10 is only an example, and according to the description of the present disclosure, other cascade relationships may be further adopted according to the actual situation. For example, the blanking input signal terminal STU1 of each stage of the shift register units may be further connected to the shift signal output terminal CR of the previous second-stage shift register unit or the next third-stage shift register unit.

Figure 11:
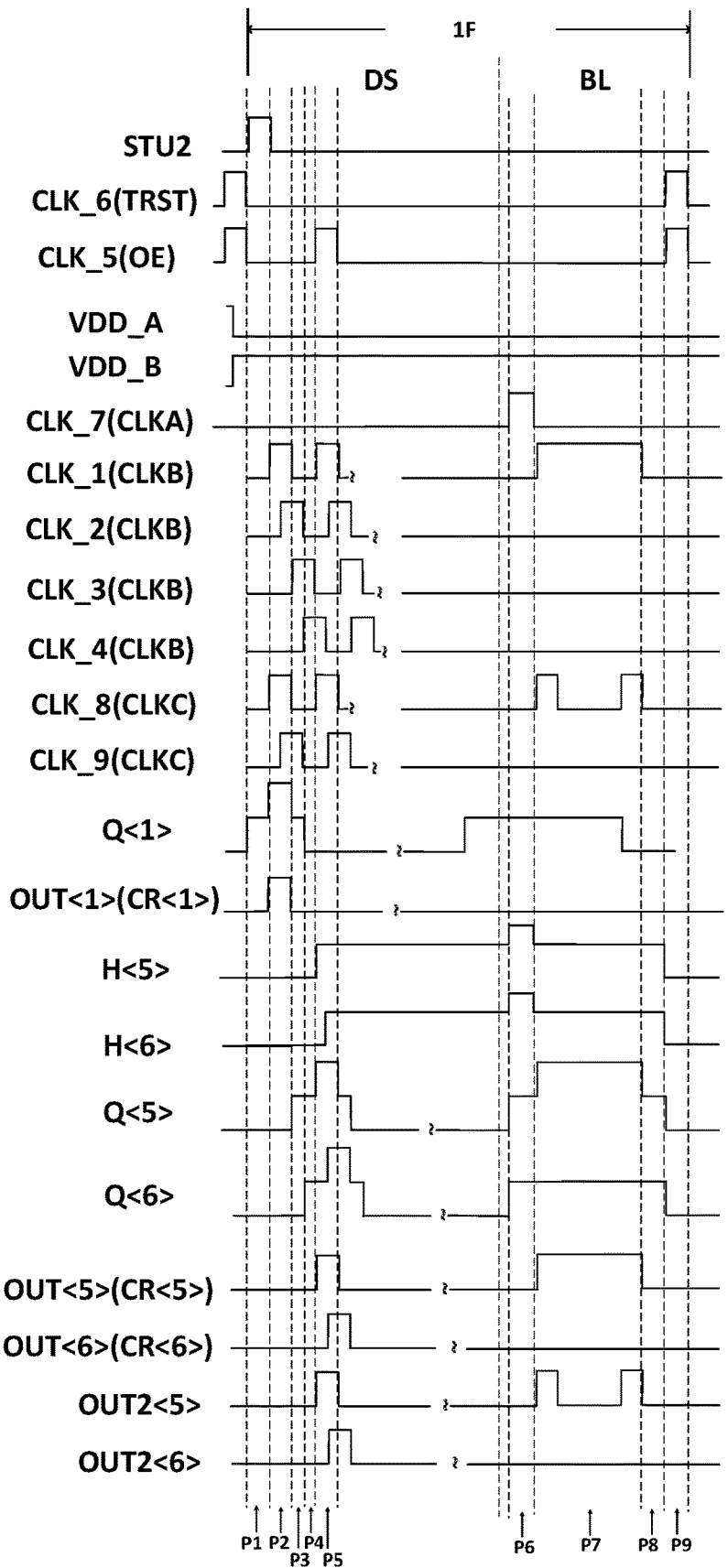
FIG. 11 is a timing diagram of signals corresponding to the gate driving circuit illustrated in FIG. 10 in operation provided by some embodiments of the present disclosure.

FIG. 11 is a timing diagram of signals corresponding to the gate driving circuit 20 illustrated in FIG. 10 in operation. In FIG. 11, H<5> and H<6> respectively indicate control nodes H in the fifth-stage shift register unit and the sixth-stage shift register unit in the gate driving circuit 20, and Q<1>, Q<5> and Q<6> respectively indicate the first nodes Q in the first-stage shift register unit, the fifth-stage shift register unit and the sixth-stage shift register unit in the gate driving circuit 20. OUT<1> (CR<1>) OUT<5> (CR<5>) and OUT<6> (CR<6>) respectively indicate pixel scanning signal output terminals OUT (shift signal output terminals CR) in the first-stage shift register unit, the fifth-stage shift register unit and the sixth-stage shift register unit in the gate driving circuit 20, and OUT2<5> and OUT2<6> respectively indicate pixel scanning signal output terminals OUT2 in the fifth-stage shift register unit and the sixth-stage shift register unit in the gate driving circuit 20. 1F indicate a first frame, DS indicates a display phase of the first frame, and BL indicates a blanking phase of the first frame. It should be noted that STU2 in FIG. 11 indicates the display input signal terminal in the first-stage shift register unit.

In addition, it should be noted that as illustrated in FIG. 11, the third voltage terminal VDD_A is input with a low-level voltage, and the fourth voltage terminal VDD_B is input with a high-level voltage, but the embodiments of the present disclosure are not limited thereto. The signal levels in the signal timing diagram as illustrated in FIG. 11 are only illustrative and do not represent real level values.

In the following, the working principle of the gate driving circuit 20 as illustrated in FIG. 10 will be described with reference to the signal timing diagram in FIG. 11. For example, the shift register unit in the gate driving circuit 20 illustrated in FIG. 10 may adopt the shift register unit as illustrated in FIG. 7.

Prior to the start of the first frame 1F, the fifth sub-clock signal line CLK_5 and the sixth sub-clock signal line CLK_6 provide a high-level signal. Because the compensation selection control terminal OE of each stage of the shift register units is connected to the fifth sub-clock signal line CLK_5, the first transistor M1 in each stage of the shift register units is turned on. At the same time, because the blanking input signal terminal STU1 is input with a low-level signal, the control node H in each stage of the shift register units can be reset. Because the total reset signal terminal TRST of each stage of the shift register units is connected to the sixth sub-clock signal line CLK_6, the sixteenth transistor M16 in each stage of the shift register units is turned on to reset the first node Q of each stage of the shift register units.

Because the fourth voltage terminal VDD_B is input with a high-level signal, the eighth transistor M8 is turned on, the level of the second node QB is charged to a high level. The high level of the second node QB causes the tenth transistor M10 to be turned on, so that the level of the first node Q can be further pulled down to a low level.

In the display phase DS of the first frame 1F, the operation of the first-stage shift register unit is described as follows.

In a first phase P1, the display input signal terminal STU2 of the first-stage shift register unit is input with a high level, and the fourth transistor M4 is turned on. Therefore, the high level input by the second voltage terminal VDD can charge the first node Q<1> through the fourth transistor M4, the level of the first node Q<1> is pulled up to a high level, and the high level of the first node Q<1> can be maintained by the second capacitor C2. The fifth transistor M5 and the sixth transistor M6 are turned on under control of the level of the first node Q<1>, but because the second clock signal terminal CLKB (connected to the first sub-clock signal line CLK1) is input with a low-level signal in the first phase P1, both the shift signal output terminal CR<1> and the pixel scanning signal output terminal OUT<1> output the low-level signal. In the first phase P1, the pre-charging of the first node Q<1> is completed.

In a second phase P2, the second clock signal terminal CLKB is input with a high-level signal, and the level of the first node Q<1> is further pulled up because of a bootstrap effect, so that the fifth transistor M5 and the sixth transistor M6 keep being turned on, and both the shift signal output terminal CR<1> and the pixel scanning signal output terminal OUT<1> output the high-level signal. For example, the high-level signal output by the shift signal output terminal CR<1> can be used for scanning shift of adjacent shift register units, and the high-level signal output by the pixel scanning signal output terminal OUT<1> can be used to drive the sub-pixel units in the display panel to perform display.

In a third phase P3, the second clock signal terminal CLKB is input with a low-level signal, at the same time, because the first node Q<1> is maintained at a high level, the fifth transistor M5 and the sixth transistor M6 keep being turned on, and both the shift signal output terminal CR<1> and the pixel scanning signal output terminal OUT<1> output the low-level signal. Due to the bootstrap effect of the second capacitor C2, the level of the first node Q<1> also decreases.

In a fourth phase P4, because the display reset signal terminal STD of the first-stage shift register unit is connected to the shift signal output terminal of the fourth-stage shift register unit, the shift signal output terminal of the fourth-stage shift register unit outputs a high-level signal in this phase. Therefore, the display reset signal terminal STD of the first-stage shift register unit is input with the high-level signal, the fifteenth transistor M15 is turned on, the level of the first node Q<1> is pulled down to a low level, thereby resetting the first node Q<1>. Because the level of the first node Q<1> is a low level, the ninth transistor M9 is turned off, and the high-level signal input by the fourth voltage terminal VDD_B can charge the second node QB. The level of the second node QB is charged to a high level, so that the tenth transistor M10 is turned on to further perform reset on the level of the first node Q<1>. Simultaneously, the eleventh transistor M11 and the twelfth transistor M12 are turned on, and the level of the shift signal output terminal CR<1> and the level of the pixel scanning signal output terminal OUT<1> are further pulled down to be reset.

After the first-stage shift register unit drives the sub-pixels in the first row in the display panel to complete the display, accordingly, the second-stage shift register unit, the third-stage shift register unit and the like progressively drive the sub-pixel units in the display panel to complete the display driving of one frame. Here, the display phase DS of the first frame 1F ends.

In addition, the control node H is charged in the display phase DS of the first frame 1F. For example, in a case where the fifth row of sub-pixel units needs to be compensated in the first frame 1F, the display phase DS of the first frame 1F also performs the following operations.

In a fifth phase P5, the shift signal output terminal CR<5> of the fifth stage shift register unit outputs a high-level signal, because the blanking input signal terminal STU1 of the fifth stage shift register unit is connected to the shift signal output terminal CR<5>, the blanking input signal terminal STU1 receives the high-level signal. At the same time, the fifth sub-clock signal line CLK_5 is provided with the same signal as the shift signal output terminal CR<5>, that is, the compensation selection control terminal OE of the fifth-stage shift register unit is input with a high-level signals, the first transistor M1 is turned on, the high-level signal input from the blanking input signal terminal STU1 charges the control node H<5>, thereby pulling up the level of the control node H<5> to a high level. Because the output waveform of the gate driving circuit overlaps, in a case where the fifth sub-clock signal line CLK_5 provides a high-level signal, the control node H<6> of the sixth-stage shift register unit is also pulled up to a high level.

The high level of the control node H<5> of the fifth stage shift register unit can be maintained until the blanking phase BL of the first frame 1F. In a case where it is necessary to compensate the fifth row of sub-pixel units in the first frame 1F, the following operations are performed in the blanking phase BL of the first frame 1F.

In a sixth phase P6, the seventh sub-clock signal line CLK_7 provides a high-level signal. Because the first clock signal terminal CLKA of the fifth-stage (sixth-stage) shift register unit is connected to the seventh sub-clock signal line CLK_7, the first clock signal is at a high level during the sixth phase, and the third transistor M3 in the fifth stage (sixth stage) shift register unit is turned on. Therefore, the high-level first clock signal can charge the first node Q<5> (Q<6>) of the fifth stage (sixth stage) shift register unit to pull up the level of the first node Q<5> (Q<6>) to a high level.

In addition, in the sixth phase P6, because the first clock signal changes from a low level to a high level, the level of the control node H<5> and the level of the control node H<6> are further pulled up by the coupling effect of the first coupling capacitor CST1 and the bootstrap effect of the second coupling capacitor CST2.

In a seventh stage P7, the second clock signal terminal CLKB (connected to the first sub-clock signal line CLK_1) is input with a high-level signal. The level of the first node Q<5> is further pulled up due to the bootstrap effect, the fifth transistor M5 and the sixth transistor M6 in the fifth-stage input-output unit are turned on, and the high-level signal input from the second clock signal terminal CLKB can be output to the shift signal output terminal CR<5> and the pixel scanning signal output terminal OUT<5>. For example, the signal output from the pixel scanning signal output terminal OUT<5> can be used to drive sense transistors in the sub-pixel units in the display panel to achieve the external compensation. In addition, the signal input from the third clock signal terminal CLKC can be output to the pixel scanning signal output terminal OUT2<5>. As illustrated in FIG. 11, the signal of OUT2<5> can be different from the signal of OUT<5>, thereby improving the driving capability of the gate driving circuit to meet diverse requirements.

In an eighth phase P8, the level of the signal input from the second clock signal terminal CLKB (connected to the first sub-clock signal line CLK_1) changes from a high level to a low level, and the level of first node Q<5> is pulled down due to the bootstrap effect.

In a ninth phase P9, the fifth sub-clock signal line CLK_5 and the sixth sub-clock signal line CLK_6 are provided with a high-level signal. Because the compensation selection control terminal OE of each stage of the shift register units is connected to the fifth sub-clock signal line CLK_5, and the total reset signal terminal TRST of each stage of the shift register units is connected to the sixth sub-clock signal line CLK_6, thereby resetting the level of the control node H and the level of the first node Q in each stage of the shift register units, and causing the control node H<5>, the control node H<6>, the first node Q<5> and the first node Q<6> to be reset.

Here, the driving timing of the first frame ends. The driving process of the gate driving circuit in the subsequent phases such as in a second frame, a third frame, and the like can be with reference to the above description, and details are not described herein again.

It should be noted that, in the above description of the working principle of the random compensation, the driving signal corresponding to the fifth row of the sub-pixel units of the display panel is output as an example during the blanking phase of the first frame, and the present disclosure are not limited thereto. For example, in a case where a driving signal corresponding to an (n)th row of sub-pixel units of the display panel is required to be output during a blanking phase of a certain frame, it is necessary to control such that the timing of the signal provided to the compensation selection control terminal OE and the timing of the signal of the blanking input signal terminal STU1 of an (n)th-stage shift register unit is the same, and n is an integer greater than zero. It should be noted that, the same timing of the two signals refers to time synchronization at a high level, and the amplitudes of the two signals are not required to be the same.

Figure 6:
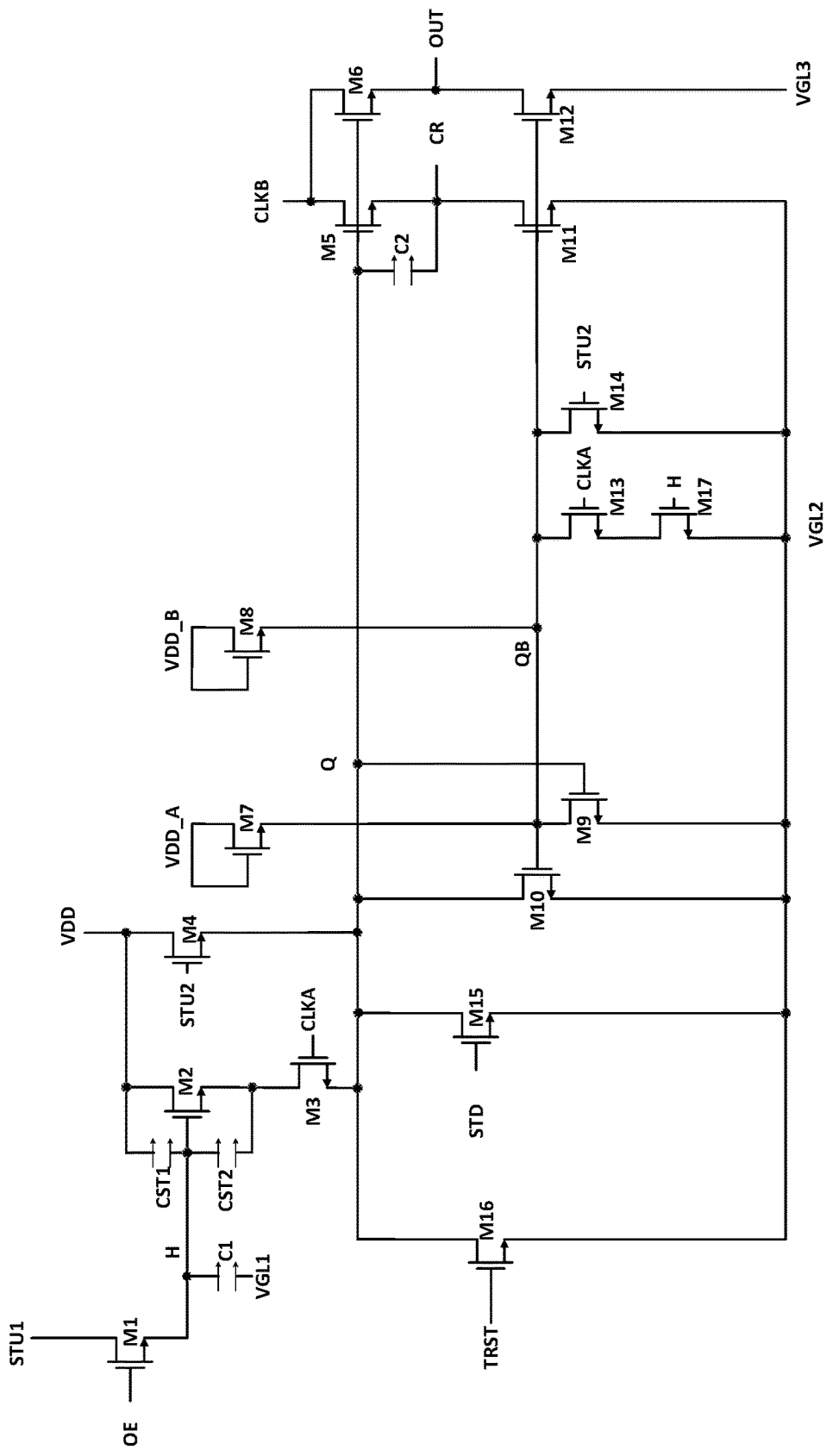
FIG. 6 is a circuit diagram of a shift register unit in a case where the first electrode of the second transistor is connected to the second voltage terminal.
Figure 12:
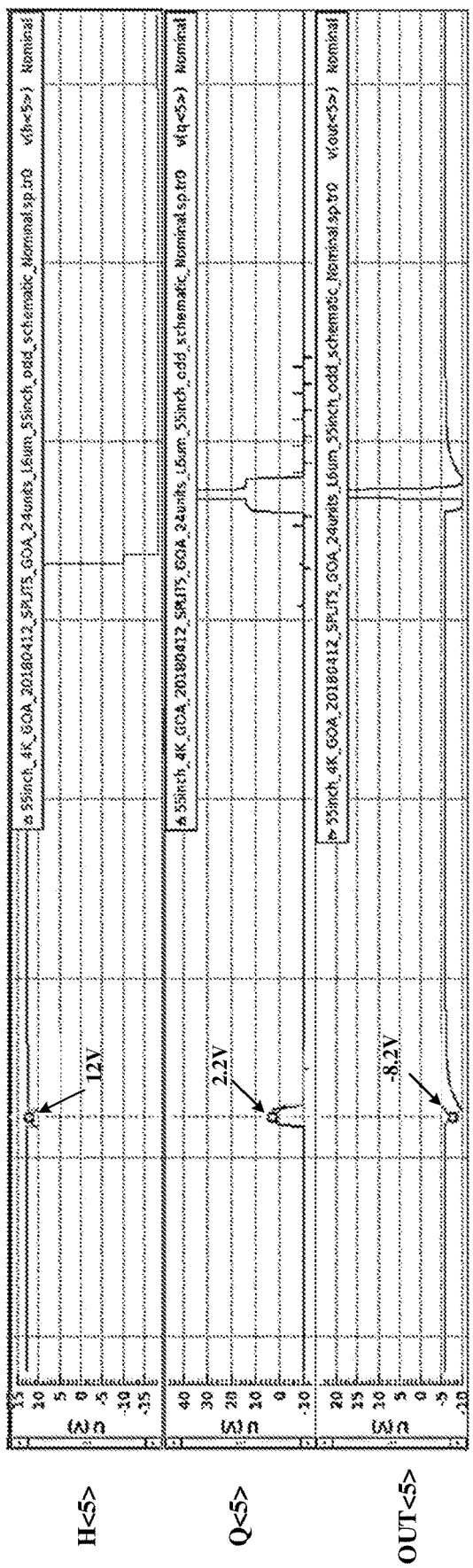
FIG. 12 is a signal simulation diagram of a gate driving circuit formed by the shift register unit as illustrated in FIG. 6.
Figure 13:
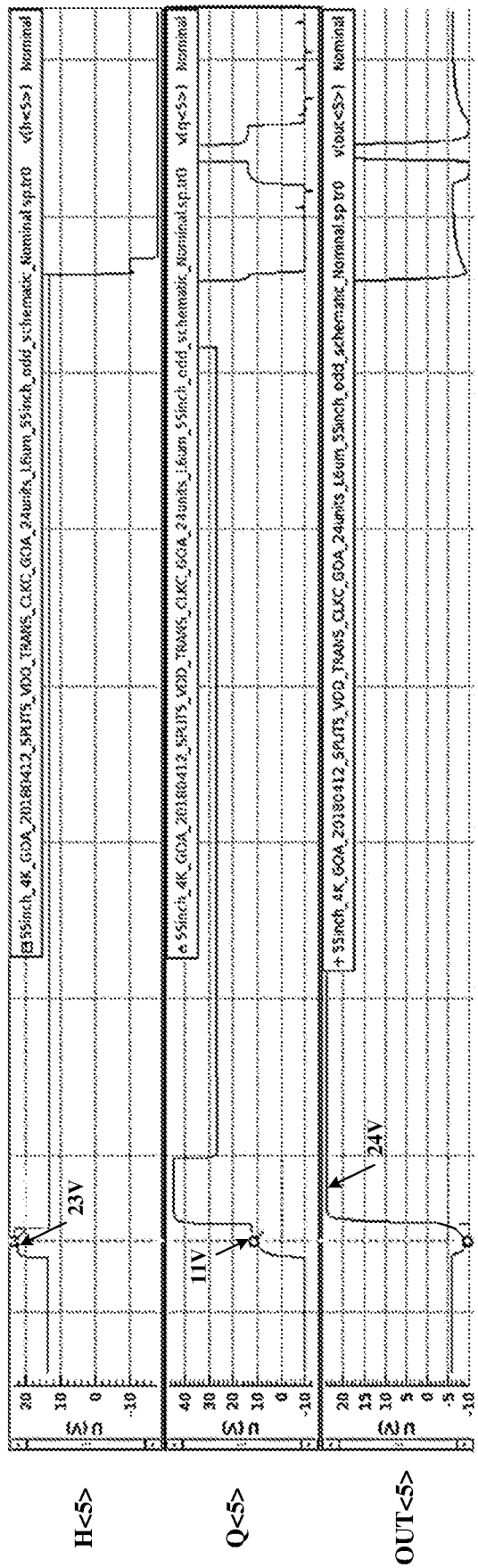
FIG. 13 is a signal simulation diagram of a gate driving circuit formed by the shift register unit as illustrated in FIG. 4.

The gate driving circuit 20 provided by the embodiment of the present disclosure is further described below with reference to the signal simulation diagrams as illustrated in FIG. 12 and FIG. 13. For example, for comparison, connecting the first electrode of the second transistor M2 in the shift register unit 10 as illustrated in FIG. 4 to the second voltage terminal VDD to obtain the shift register unit as illustrated in FIG. 6. FIG. 12 is a signal simulation diagram of a gate driving circuit formed by a plurality of the shift register unit as illustrated in FIG. 6, and FIG. 13 is a signal simulation diagram of a gate driving circuit formed by a plurality of the shift register unit as illustrated in FIG. 4. It should be noted that the signal simulation diagrams as illustrated in FIG. 12 and FIG. 13 are the signal simulation diagrams of the fifth-stage shift register unit in a case where the fifth row of sub-pixel units is compensated. FIG. 12 and FIG. 13 both start from a blanking phase of one frame and then continue to a display phase of a next frame.

As illustrated in FIG. 12, in a case where the first electrode of the second transistor M2 is connected to the second voltage terminal VDD, because there is no coupling control function of the first clock signal, the level of the control node H<5> is 12V, and correspondingly, the level of the first node Q<5> after charging is 2.2V. In this case, the output level of the pixel scanning signal output terminal OUT<5> is −8.2V, and an output abnormality may occur.

However, as illustrated in FIG. 13, in a case where the first electrode of the second transistor M2 is connected to the first clock signal terminal CLKA, the level of the control node H<5> can be pulled to 23V by a coupling control function of the blanking coupling circuit 130, so that the first node Q<5> is charged more sufficiently. As illustrated in FIG. 13, the level of the first node Q<5> after charging is 11V. In this case, the output level of the pixel scanning signal output terminal OUT<5> is 24V, and no output abnormality occurs.

As described above, by providing the blanking coupling circuit 130 to perform control, by coupling, on the level of the control node H can prevent the control node H from leaking, thereby allowing the first node Q to be charged more sufficiently in a blanking phase of one frame, so as to avoid the abnormal output.

Figure 14:
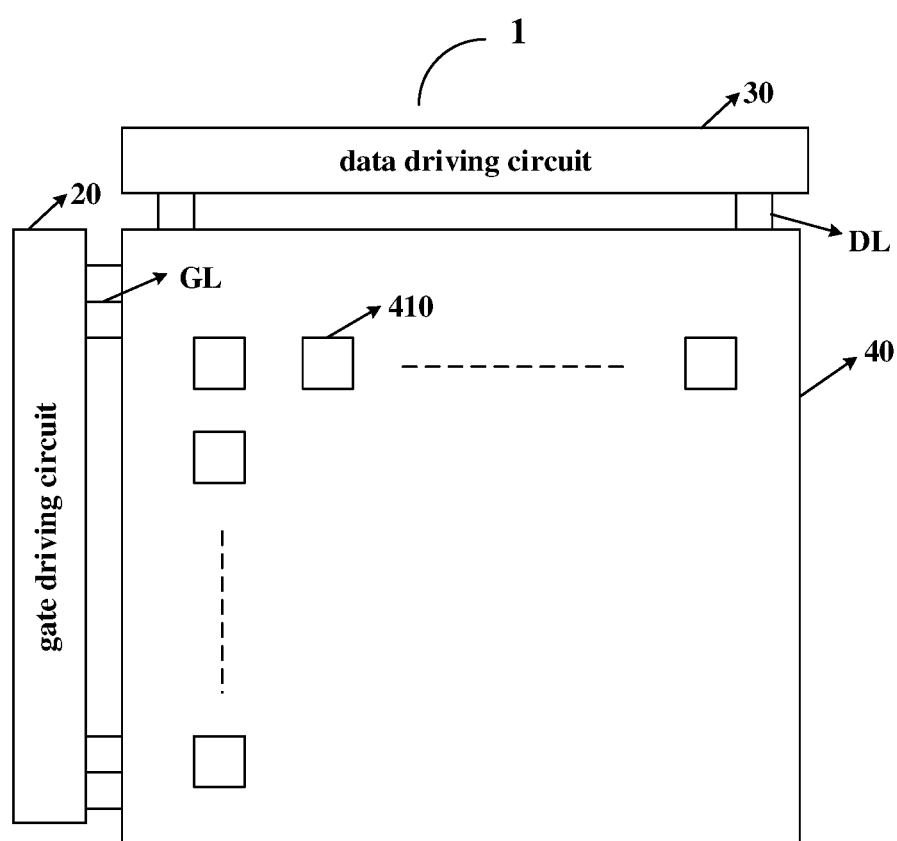
FIG. 14 is a schematic diagram of a display device provided by some embodiments of the present disclosure.

The embodiment of the present disclosure further provides a display device 1, and as illustrated in FIG. 14, the display device 1 includes the gate driving circuit 20 provided by the embodiment of the present disclosure. The display device 1 further includes a display panel 40, and the display panel 40 includes an array including a plurality of sub-pixel units 410. For example, the display device 1 further includes a data driving circuit 30. The data driving circuit 30 is configured to provide data signals to the pixel array; and the gate driving circuit 20 is configured to provide driving signals to the pixel array, and for example, the driving signal can drive the scanning transistor and the sensing transistor in the sub-pixel unit 410. The data driving circuit 30 is electrically connected to the sub-pixel unit 410 through the data line DL, and the gate driving circuit 20 is electrically connected to the sub-pixel unit 410 through the gate line GL.

It should be noted that the display device 1 in the present embodiments may be: a liquid crystal panel, a liquid crystal television, a display screen, an OLED panel, an OLED television, an electronic paper display device, a mobile phone, a tablet computer, a notebook computer, a digital photo frame, a navigator, or any product or component with the display function.

The technical effects of the display device 1 provided by the embodiments of the present disclosure can be with reference to the corresponding description of the gate driving circuit 20 in the above embodiments, and details are not described herein again.

Figure 15:
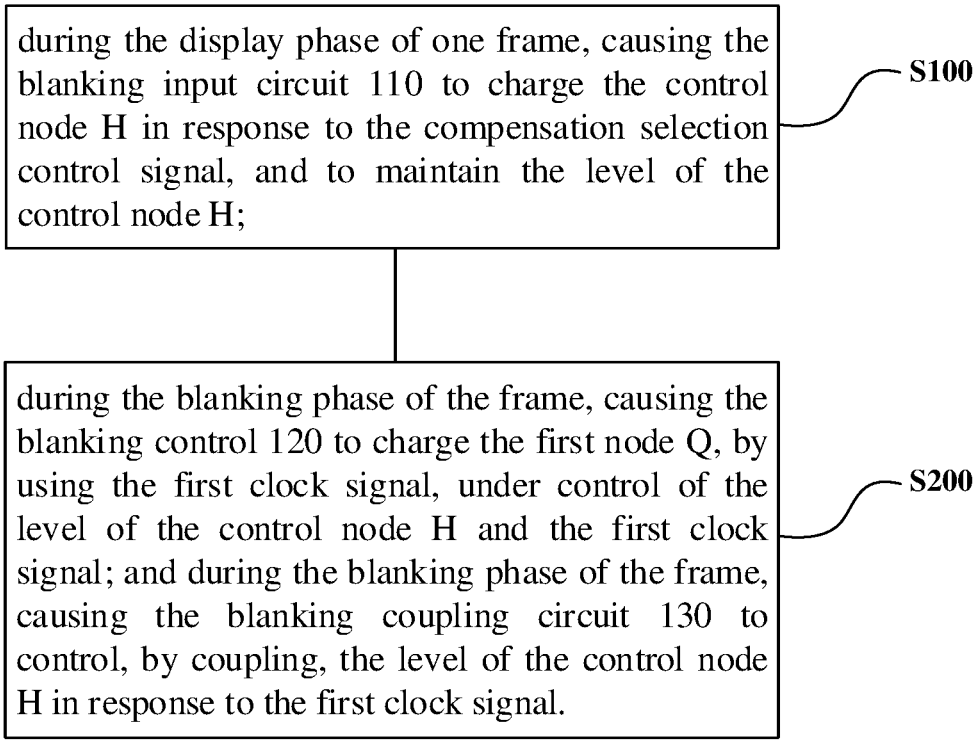
FIG. 15 is a schematic diagram of a driving method of the shift register unit provided by some embodiments of the present disclosure.

The embodiment of the present disclosure further provides a driving method that can be used to drive the shift register unit 10 provided by the embodiment of the present disclosure, a plurality of the shift register units 10 can be cascaded to form the gate driving circuit provided by an embodiment of the present disclosure, and the gate driving circuit is used to drive the display panel to display at least one frame. The driving method includes a display phase for one frame and a blanking phase for the frame. As illustrated in FIG. 15, the driving method includes the following steps.

Step S100: during the display phase of one frame, causing the blanking input circuit 110 to charge the control node H in response to the compensation selection control signal, and to maintain the level of the control node H.

Step S200: during the blanking phase of the frame, causing the blanking control 120 to charge the first node Q, by using the first clock signal, under control of the level of the control node H and the first clock signal; and during the blanking phase of the frame, causing the blanking coupling circuit 130 to control, by coupling, the level of the control node H in response to the first clock signal.

It should be noted that the detailed description and technical effects of the driving method provided by the embodiments of the present disclosure may be with reference to the description of the working principle of the shift register unit 10 and the gate driving circuit 20 in the embodiments of the present disclosure, and details are not described herein again.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising a blanking input circuit, a blanking control circuit, a blanking coupling circuit, a display input circuit and an output circuit, wherein the blanking input circuit is configured to charge a control node in response to a compensation selection control signal, and to maintain a level of the control node;

the blanking control circuit is configured to charge a first node, by using a first clock signal, under control of the first clock signal and the level of the control node;

the blanking coupling circuit is electrically connected to the control node, and is configured to control, by coupling, the level of the control node in response to the first clock signal;

the display input circuit is configured to charge the first node in response to a display input signal; and the output circuit is configured to output a composite output signal to an output terminal under control of a level of the first node.

2. The shift register unit according to claim 1, wherein the blanking input circuit comprises a first transistor and a first capacitor;

a gate electrode of the first transistor is connected to a compensation selection control terminal to receive the compensation selection control signal, a first electrode of the first transistor is connected to a blanking input signal terminal, and a second electrode of the first transistor is connected to the control node; and a first electrode of the first capacitor is connected to the control node, and a second electrode of the first capacitor is connected to a first voltage terminal.

3. The shift register unit according to claim 2, wherein the blanking control circuit comprises a second transistor and a third transistor;

a gate electrode of the second transistor is connected to the control node, a first electrode of the second transistor is connected to a first clock signal terminal to receive the first clock signal, and a second electrode of the second transistor is connected to a first electrode of the third transistor; and a gate electrode of the third transistor is connected to the first clock signal terminal to receive the first clock signal, and a second electrode of the third transistor is connected to the first node.

4. The shift register unit according to claim 3, wherein the blanking coupling circuit comprises a first coupling capacitor, a first electrode of the first coupling capacitor is connected to the first clock signal terminal to receive the first clock signal, and a second electrode of the first coupling capacitor is connected to the control node.

5. The shift register unit according to claim 1, wherein the display input circuit comprises a fourth transistor, a gate electrode of the fourth transistor is connected to a display input signal terminal to receive the display input signal, a first electrode of the fourth transistor is connected to a second voltage terminal to receive a second voltage, and a second electrode of the fourth transistor is connected to the first node.

6. The shift register unit according to claim 1, wherein the output terminal comprises a shift signal output terminal and a pixel scanning signal output terminal, the shift signal output terminal and the pixel scanning signal output terminal output the composite output signal, and the output circuit comprises a fifth transistor and a sixth transistor;

a gate electrode of the fifth transistor is connected to the first node, a first electrode of the fifth transistor is connected to a second clock signal terminal to receive a second clock signal and the second clock signal is used as the composite output signal, and a second electrode of the fifth transistor is connected to the shift signal output terminal; and a gate electrode of the sixth transistor is connected to the first node, a first electrode of the sixth transistor is connected to the second clock signal terminal to receive the second clock signal and the second clock signal is used as the composite output signal, and a second electrode of the sixth transistor is connected to the pixel scanning signal output terminal.

7. The shift register unit according to claim 6, wherein the output circuit further comprises a second capacitor, a first electrode of the second capacitor is connected to the first node, and a second electrode of the second capacitor is connected to the second electrode of the fifth transistor.

8. The shift register unit according to claim 1, further comprising a first control circuit and a node control circuit, wherein the output terminal comprises a shift signal output terminal and a pixel scanning signal output terminal, and the shift signal output terminal and the pixel scanning signal output terminal output the composite output signal;

the first control circuit is configured to control a level of a second node under control of the level of the first node; and the node control circuit is configured to reset the first node, the shift signal output terminal, and the pixel scanning signal output terminal under control of the level of the second node.

9. The shift register unit according to claim 8, wherein the first control circuit comprises a seventh transistor and a ninth transistor;

a gate electrode of the seventh transistor is connected to a first electrode of the seventh transistor and is configured to be connected to a third voltage terminal to receive a third voltage, and a second electrode of the seventh transistor is connected to the second node; and a gate electrode of the ninth transistor is connected to the first node, a first electrode of the ninth transistor is connected to the second node, and a second electrode of the ninth transistor is connected to a fifth voltage terminal to receive a fifth voltage.

10. The shift register unit according to claim 9, wherein the first control circuit further comprises an eighth transistor, a gate electrode of the eighth transistor is connected to a first electrode of the eighth transistor and is configured to be connected to a fourth voltage terminal to receive a fourth voltage, and a second electrode of the eighth transistor is connected to a third node different from the second node.

11. The shift register unit according to claim 8, wherein the node control circuit comprises a tenth transistor, an eleventh transistor, and a twelfth transistor;

a gate electrode of the tenth transistor is connected to the second node, a first electrode of the tenth transistor is connected to the first node, and a second electrode of the tenth transistor is connected to a fifth voltage terminal to receive a fifth voltage;

a gate electrode of the eleventh transistor is connected to the second node, a first electrode of the eleventh transistor is connected to the shift signal output terminal, and a second electrode of the eleventh transistor is connected to the fifth voltage terminal to receive the fifth voltage; and a gate electrode of the twelfth transistor is connected to the second node, a first electrode of the twelfth transistor is connected to the pixel scanning signal output terminal, and a second electrode of the twelfth transistor is connected to a sixth voltage terminal to receive a sixth voltage.

12. The shift register unit according to claim 8, further comprising a second control circuit and a third control circuit,
wherein the second control circuit is configured to control the level of the second node in response to the first clock signal; and
the third control circuit is configured to control the level of the second node in response to the display input signal.

13. The shift register unit according to claim 12, wherein the second control circuit comprises a thirteenth transistor, and the third control circuit comprises a fourteenth transistor;
a gate electrode of the thirteenth transistor is connected to a first clock signal terminal to receive the first clock signal, a first electrode of the thirteenth transistor is connected to the second node, and a second electrode of the thirteenth transistor is connected to a fifth voltage terminal to receive a fifth voltage; and
a gate electrode of the fourteenth transistor is connected to a display input signal terminal to receive the display input signal, a first electrode of the fourteenth transistor is connected to the second node, and a second electrode of the fourteenth transistor is connected to the fifth voltage terminal to receive the fifth voltage.

14. The shift register unit according to claim 12, wherein the second control circuit comprises a thirteenth transistor and a seventeenth transistor, and the third control circuit comprises a fourteenth transistor;
a gate electrode of the thirteenth transistor is connected to a first clock signal terminal to receive the first clock signal, a first electrode of the thirteenth transistor is connected to the second node, and a second electrode of the thirteenth transistor is connected to a first electrode of the seventeenth transistor;
a gate electrode of the seventeenth transistor is electrically connected to the control node, and a second electrode of the seventeenth transistor is connected to a fifth voltage terminal to receive a fifth voltage; and
a gate electrode of the fourteenth transistor is connected to a display input signal terminal to receive the display input signal, a first electrode of the fourteenth transistor is connected to the second node, and a second electrode of the fourteenth transistor is connected to the fifth voltage terminal to receive the fifth voltage.

15. The shift register unit according to claim 8, further comprising a display reset circuit and a total reset circuit,
wherein the display reset circuit is configured to reset the first node in response to a display reset signal; and
the total reset circuit is configured to reset the first node in response to a total reset signal.

16. A gate driving circuit, comprising a plurality of cascaded shift register units according to claim 1.

17. The gate driving circuit according to claim 16, further comprising a first sub-clock signal line, a second sub-clock signal line, a third sub-clock signal line, and a fourth sub-clock signal line,
wherein a (4n−3)th-stage shift register unit of the cascaded shift register units is connected to the first sub-clock signal line to receive a second clock signal,
a (4n−2)th-stage shift register unit of the cascaded shift register units is connected to the second sub-clock signal line to receive a second clock signal,
a (4n−1)th-stage shift register unit of the cascaded shift register units is connected to the third sub-clock signal line to receive a second clock signal,
a (4n)th-stage shift register unit of the cascaded shift register units is connected to the fourth sub-clock signal line to receive a second clock signal, and
n is an integer greater than zero.

18. The gate driving circuit according to claim 17, further comprising a fifth sub-clock signal line and a sixth sub-clock signal line,
wherein each stage of the cascaded shift register units is connected to the fifth sub-clock signal line to receive a compensation selection control signal, and each stage of the cascaded shift register units is connected to the sixth sub-clock signal line to receive a total reset signal.

19. A display device, comprising the gate driving circuit according to claim 16.

20. A driving method of the shift register unit according to claim 1, comprising a display phase for one frame and a blanking phase for the frame,
during the display phase, causing the blanking input circuit to charge the control node in response to the compensation selection control signal and to maintain the level of the control node; and
during the blanking phase, causing the blanking control circuit to charge the first node, by using the first clock signal, under control of the first clock signal and the level of the control node, and causing the blanking coupling circuit to control, by coupling, the level of the control node in response to the first clock signal.

* * * * *